US006629053B1

(12) United States Patent
Mooring

(10) Patent No.: US 6,629,053 B1
(45) Date of Patent: Sep. 30, 2003

(54) METHOD AND APPARATUS FOR DETERMINING SUBSTRATE OFFSET USING OPTIMIZATION TECHNIQUES

(75) Inventor: Benjamin W. Mooring, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/527,059

(22) Filed: Mar. 16, 2000

Related U.S. Application Data

(63) Continuation-in-part of application No. 09/470,780, filed on Dec. 23, 1999.
(60) Provisional application No. 60/167,262, filed on Nov. 22, 1999.

(51) Int. Cl.[7] .................................................. G06F 9/00
(52) U.S. Cl. ........................... 702/94; 702/35; 702/149; 702/150; 702/152
(58) Field of Search .................................. 702/150, 188, 702/149, 152, 35, 94, FOR 155; 438/7, 9, 10; 700/81, 86; 901/46

(56) References Cited

U.S. PATENT DOCUMENTS

| | | | | |
|---|---|---|---|---|
| 4,819,167 A | | 4/1989 | Cheng et al. ........... | 364/167.01 |
| 4,833,790 A | | 5/1989 | Spencer et al. ............... | 33/520 |
| 4,871,955 A | | 10/1989 | Berger ......................... | 318/640 |
| 4,980,626 A | | 12/1990 | Hess et al. ............. | 318/568.16 |
| 5,379,231 A | * | 1/1995 | Pillage et al. ................ | 364/488 |
| 5,483,138 A | | 1/1996 | Shmookler et al. ..... | 318/568.16 |
| 5,769,952 A | | 6/1998 | Komino ....................... | 118/733 |
| 5,980,194 A | | 11/1999 | Freerks et al. ............... | 414/754 |
| 6,102,164 A | | 8/2000 | McClintock et al. ........ | 187/267 |
| 6,244,121 B1 | | 6/2001 | Hunter ....................... | 73/865.9 |
| 6,256,555 B1 | * | 7/2001 | Bacchi et al. ............... | 700/245 |
| 6,279,724 B1 | * | 8/2001 | Davis ....................... | 198/465.2 |
| 6,298,280 B1 | | 10/2001 | Bonora et al. .............. | 700/218 |
| 6,360,144 B1 | * | 3/2002 | Bacchi et al. ............... | 700/250 |
| 6,405,101 B1 | * | 6/2002 | Johanson et al. ........... | 700/218 |

FOREIGN PATENT DOCUMENTS

| | | | | |
|---|---|---|---|---|
| EP | 0508748 | | 10/1992 | ........... H01L/21/00 |
| GB | 2180097 | | 3/1987 | ........... H01L/21/68 |

OTHER PUBLICATIONS

W. Press, S. Teukolsky, W. Vetterling and B. Flannery, "Numerical Recipes in C", pp. 408–412, 1988, 1997, © Cambridge University Press, New York, NY.

* cited by examiner

*Primary Examiner*—Marc S. Hoff
*Assistant Examiner*—Felix Suarez
(74) *Attorney, Agent, or Firm*—Martine & Penilla, LLP

(57) ABSTRACT

Dynamic alignment of a wafer with a blade that carries the wafer involves determination of an approximate value of wafer offset with respect to a desired location of the wafer in a module. This determination is made using an optimization program. The wafer is picked up from a first location using an end effector that transfers the picked up wafer from the first location past sensors to produce sensor data. For an unknown wafer offset, the picked up wafer is misaligned with respect to a desired position of the picked up wafer on the end effector. When the desired position does not correspond to original target coordinates to which the end effector normally moves, the original target coordinates are modified to compensate for the approximate value of the offset and the picked up wafer is placed at the modified target coordinates to compensate for the unknown offset and the misalignment.

31 Claims, 23 Drawing Sheets

METHOD AND APPARATUS FOR DETERMINING SUBSTRATE OFFSET USING OPTIMIZATION TECHNIQUES

CROSS REFERENCE TO RELATED APPLICATIONS

This application is a continuation-in-part of, and claims priority from, U.S. patent application Ser. No. 09/470,780, filed Dec. 23, 1999, and entitled "Method and Apparatus For Dynamic Alignment of Substrates," which claimed priority from U.S. Provisional Application No. 60/167,262, filed Nov. 22, 1999, and entitled "Substrate Dynamic Alignment." Both such Application and Provisional Application are herein incorporated by reference.

BACKGROUND OF THE INVENTION

1. Field of the Invention

The present invention relates generally to transferring wafers among modules of semiconductor processing equipment, and more particularly to dynamic alignment of each wafer with a support blade that carries the wafer, wherein dynamic alignment apparatus and methods define, as a statement of an optimization program, the determination of an approximate value of an offset of the wafer with respect to a desired location of the wafer in a module.

2. Description of the Related Art

In the manufacture of semiconductor devices, process chambers are interfaced to permit transfer of wafers or substrates, for example, between the interfaced chambers. Such transfer is via transport modules that move the wafers, for example, through slots or ports that are provided in the adjacent walls of the interfaced chambers. Transport modules are generally used in conjunction with a variety of wafer processing modules, which may include semiconductor etching systems, material deposition systems, and flat panel display etching systems. Due to the growing demands for cleanliness and high processing precision, there has been a growing need to reduce the amount of human interaction during and between processing steps. This need has been partially met with the implementation of vacuum transport modules which operate as an intermediate wafer handling apparatus (typically maintained at a reduced pressure, e.g., vacuum conditions). By way of example, a vacuum transport module may be physically located between one or more clean room storage facilities where wafers are stored, and multiple wafer processing modules where the wafers are actually processed, e.g., etched or have deposition performed thereon. In this manner, when a wafer is required for processing, a robot arm located within the transport module may be employed to retrieve a selected wafer from storage and place it into one of the multiple processing modules.

As is well known to those skilled in the art, the arrangement of transport modules to "transport" wafers among multiple storage facilities and processing modules is frequently referred to as a "cluster tool architecture" system. FIG. 1 depicts a typical semiconductor process cluster architecture 100 illustrating the various chambers that interface with a vacuum transport module 106. Vacuum transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering.

Connected to vacuum transport module 106 is a load lock 104 that may be implemented to introduce wafers into vacuum transport module 106. Load lock 104 may be coupled to a clean room 102 where wafers are stored. In addition to being a retrieving and serving mechanism, load lock 104 also serves as a pressure-varying interface between vacuum transport module 106 and clean room 102. Therefore, vacuum transport module 106 may be kept at a constant pressure (e.g., vacuum), while clean room 102 is kept at atmospheric pressure.

Consistent with the growing demands for cleanliness and high processing precision, the amount of human interaction during and between processing steps has been reduced by the use of robots for wafer transfer. Such transfer may be from the clean room 102 to the load lock 104, or from the load lock 104 to the vacuum transport module 106, or from the vacuum transport module 106 to a processing module 108a, for example. While such robots substantially reduce the amount of human contact with each wafer, problems have been experienced in the use of robots for wafer transfer. For example, in a clean room a blade of a robot may be used to pick a wafer from a cassette and place it on fingers provided in the load lock 104. However, the center of the wafer may not be accurately positioned relative to the fingers. As a result, when the blade of the robot of the vacuum transport module 106 picks the wafer from the fingers of the load lock 104, the center of the wafer may not be properly located, or aligned, relative to the center of the blade. This improper wafer center-blade center alignment, also referred to as "wafer-blade misalignment" or simply "wafer misalignment," continues as the robot performs an "extend" operation, by which the blade (and the wafer carried by the blade) are moved through a slot in the processing module and by which the wafer is placed on pins in the processing module 108a, for example.

Even if there was proper original wafer-blade alignment when the wafer was initially placed in the exemplary processing module 108a, and even though the wafer may have thus been properly aligned during processing in the exemplary processing module 108a, the proper alignment may be interfered with. For example, electrostatic chucks generally used in the exemplary processing modules 108a may have a residual electrostatic field that is not completely discharged after completion of the processing. In this situation, the processed wafer may suddenly become detached from the chuck. As a result, the wafer may become improperly positioned with respect to the robot blade that picks the processed wafer off the chuck. Thus, when the blade of the robot of the vacuum transport module 106 picks the processed wafer off the chuck, the center of the wafer may not be properly located, or aligned, relative to the center of the blade. This wafer misalignment may continue as the robot performs a "retract" operation, by which the blade (and the wafer carried by the blade) are moved through the slot in the processing module 108a. Such wafer misalignment may also continue during a subsequent extend operation by which the wafer is placed in another one of the processing modules 108b, or in the load lock 104.

The above-described wafer misalignment before an extend operation (which may continue to the time at which the wafer is placed on pins in the processing module 108a), and the above-described wafer misalignment before a retract operation (which may continue during a subsequent extend operation by which the wafer is placed in another one of the processing modules 108b, or in the load lock 104) results in placement of the wafer at a location that is offset from a desired location on the pins of the module 108a or module 108b or in the load lock 104.

Wafer misalignment, and resulting offset, are sources of wafer processing errors, and are of course to be avoided. It is also clear that the amount of time the robots take to transfer a wafer among the modules (the "wafer transfer time period") is an amount of time that is not available for performing processing on the wafer, i.e., the wafer transfer time period is wasted time. Thus, there is an unfilled need to both monitor the amount of such wafer misalignment, and to perform such monitoring without increasing the wafer transfer time period. One aspect of monitoring the amount of wafer misalignment, or of determining the amount of such wafer offset, is the period of time required to compute the offset (the "offset computation time period"). If increases in the wafer transfer time period are to be avoided yet the amount of such wafer offset is to be determined to a sufficient degree of offset accuracy before the wafer is placed relative to the desired location, the offset computation time period must be no more than a portion of the wafer transfer time period.

A problem complicating such monitoring of wafer misalignment is that a wafer may be transferred from (or to) the one vacuum transport module 106 to (or from) as many as six, for example, processing modules, e.g., 108a. In the past, attempts to determine whether a wafer is properly aligned on the blade of a robot have included use of many sensors between adjacent modules. Sensors on opposite sides of a wafer transfer path have been located symmetrically with respect to the wafer transfer path. The symmetrically opposed sensors produce simultaneous output signals, and one data processor has to be provided for each such sensor. The combination of these factors (i.e., the possible use of six processing modules plus the vacuum transport module, the use of many symmetrically located opposing sensors per module, and the use of one data processor per sensor) result in increased complexity and the need for many costly processors for a cluster tool architecture. In view of the need to provide cluster tool architectures that are more cost-efficient, the incorporation of separate data processors for each sensor can make a system prohibitively expensive.

Another aspect of providing cluster tool architectures that are more cost-efficient relates to the cost of machining the modules and the load locks to provide apertures in which sensors, such as through-beam sensors, may be received. As the accuracy of such machining is increased to more accurately locate the sensors with respect to the robots, for example, there are increased costs of such precision machining. What is needed is a way of requiring less accuracy in machining the apertures for the sensors without sacrificing the accuracy of detections made using the sensors.

The use of such through-beam sensors also presents problems in the design of apparatus for monitoring wafer misalignment. For example, when a wafer moves through a light beam of such a through-beam sensor and breaks the beam, it takes a period of time (latency period) for the sensor to output a pulse indicative of the breaking of the beam. Since the wafer is moving relative to the sensor, and when the purpose of the sensor is to determine the location of the wafer, by the time the output pulse is generated (at the end of the latency period) the wafer will have moved from the location of the wafer when the beam was broken. The latency period is a source of errors in the use of the through-beam sensors. What is also needed then is a way of reducing the errors caused by the latency period of through-beam sensors.

In view of the foregoing, there is a need for methods and apparatus for wafer alignment that operate while the wafer is being transported without increasing the wafer transport time period (e.g., without reducing the rate of transfer of the wafer among the modules or load locks nor increasing the total required to transfer a wafer to the desired location). Such method and apparatus should not only avoid having an offset computation time period longer than the wafer transfer time period, but should also result in determinations of the wafer offset having a significantly improved degree of accuracy. Further, the number of data processors per sensor should be reduced, and there should be a reduction of the total number of data processors used for determination of wafer misalignment in an entire cluster tool architecture. Such method and apparatus desirably also require less accuracy in machining the apertures for the sensors, without sacrificing the accurary of detections made using the sensors. Another aspect of the desire method and apparatus is to reduce errors resulting from the latency period in using through-beam sensors to make wafer alignment determinations.

SUMMARY OF THE INVENTION

Broadly speaking, the present invention fills these needs by providing dynamic alignment of each wafer with a support blade that carries the wafer. Dynamic alignment apparatus and methods define the determination of an approximate value of an offset of the wafer with respect to a desired location of the wafer on the support blade, and this determination is in terms of a statement of an optimization program. By stating the task of determination of this approximate offset value with respect to an optimization program, the offset computation time period required to compute the approximate value of the offset effectively stays within the wafer transfer time period, and the probability of a successful convergence to a precise value of the offset is higher than with non-optimization programs.

One aspect of the present invention is a method and apparatus for determining an amount of an unknown offset of a wafer with respect to a desired location, wherein the wafer is picked up from a first location using an end effector and the end effector is moved to transfer the picked up wafer from the first location past a set of sensors to produce sensor data. By processing the sensor data using an optimization program, this aspect effectively keeps the offset computation time period required for the determination of the approximate value of the unknown offset less than the wafer transfer time period. When the optimization program is a most preferred simplex algorithm, there is not only a very high probability that the approximate value of the offset will be determined within the offset computation time period, but the determined approximate value of the offset will be substantially more accurate than that obtained using such non-optimization programs as the geometric program, for example.

Another aspect of the present invention relates to the event of an unknown offset of a wafer, such that the picking up operation results in the picked up wafer being misaligned with respect to a desired position of the picked up wafer on the end effector. When the desired location corresponds to original target coordinates to which the end effector normally moves, the original target coordinates are modified to compensate for the approximate value of the offset. The end effector is then caused to place the picked up wafer at the modified target coordinates to compensate for the unknown offset and the misalignment.

A further aspect of the present invention defines the unknown offset as "e" within a coordinate system centered at the desired wafer location. The unknown offset "e" has components "$e_x$," and "$e_y$," extending from the center of the coordinate system to the center of the misaligned wafer. A processing operation expresses the sensor data in terms of a vector extending from the center of the coordinate system to each of the effective locations of each of the sensors at the time at which the moving wafer causes a particular one of the sensors to produce the sensor data. Such expressing results in a set of the vectors, the set being identified as "$r_p$," where "i" varies from 1 to 4, each of the vectors "$r_{pi}$" having a first component "$r_{pix}$" and a second component "$r_{piy}$". The present invention determines the value of the components "$e_x$," and "$e_y$," which will minimize the sum of the squares of the distances between each vector and the adjacent wafer edge as defined by the vectors "$r_{pi}$". The function to be minimized is given by:

$$F = \sum_{i=1}^{4} \left[ R - \sqrt{(r_{pix} - e_x)^2 + (r_{piy} - e_y)^2} \right]^2$$

and the wafer has a radius "R" from a center of the wafer to an edge of the wafer.

Yet another aspect of the present invention is that the processing operation is further performed by determining a minimum value of "F" as defined in the last mentioned equation by repeatedly solving for "F" by substituting a plurality of values of "$e_x$", and "$e_y$" until the lowest value of "F" is obtained.

A still further aspect of the present invention relates to a method for determining an amount of an unknown offset of a wafer with respect to a desired location within a wafer handling system. In this aspect a robot having an end effector is used to support and move the wafer past a set of sensors adjacent to a particular facet of the wafer handling system to produce sensor trigger data. Calibrated sensor position data is provided indicating the effective position of each sensor with respect to the particular facet. Processing of the sensor trigger data, of the corresponding position of the end effector, and of the sensor position data is performed using an optimization program to determine an approximate value of the unknown offset.

A related aspect of the present invention provides that the processing operation determines wafer edge location vectors (identified as "$r_{pi}$") in a coordinate system centered on the desired location of the wafer on the blade. The processing operation uses the sensor location as defined by a calibration process and the location of the robot blade when each sensor is triggered to determine the vectors "$r_{pi}$". The last-mentioned determining uses the calibrated sensor position data, the robot blade position, and the sensor trigger data.

A still related aspect of the present invention provides that in the processing operation the term "i" has the values 1, 2, 3, and 4 representing four of the items of sensor trigger data; wherein each of the corresponding four vectors "$r_{pi}$" has an "X" axis and a "Y" axis component. The processing of the optimization program determines the location of the wafer that best fits the four wafer edge locations, wherein the best fit location is obtained by optimizing solutions to the above-described equation, wherein "R" is the radius of the wafer, "$r_{pix}$" is an "X" axis component of "$r_{pi}$," "$r_{piy}$" is a "Y" axis component of "$r_{pi}$", "$e_x$" is a selected "X" axis component of an approximation of the unknown offset, "$e_y$" is a selected "Y" component of an approximation of the unknown offset, and optimization is performed using a two dimensional simplex algorithm.

One further aspect of the present invention relates to a computer for determining an amount of an unknown offset of the wafer with respect to the desired wafer location. The computer is programmed to perform operations including first causing the wafer to be picked up from a first location by an end effector. Also, there is second causing the end effector to move and transport the picked up wafer from the first location past a set of sensors to produce sensor data. Finally, programming processes the sensor data using an optimization program to determine an approximate value of the unknown offset.

By the described aspects of determining the amount of such wafer offset, the offset computation time period is normally less than the wafer transfer time period, and is normally substantially less than the wafer transfer time period. As compared to the geometric (non-optimization) techniques, the optimization programs provide significantly less error in the value determined for the offset.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 3A is a plan view of a portion of one face of the vacuum transport module of the cluster tool architecture, schematically showing part of a system for dynamic alignment according to the present invention, and showing a second sensor used with a wafer having a diameter of 200 mm.

DETAILED DESCRIPTION OF THE PREFERRED EMBODIMENTS

An invention is described for wafer alignment that operates while the wafer is being transported and without increasing the wafer transfer time period (e.g., without reducing the rate of transfer of the wafer among the modules or load locks nor increasing the total time required to transfer a wafer to the desired location). The wafer alignment not only avoids having an offset computation time period longer than the wafer transfer time period, but the computation for determining the amount of misalignment to be corrected determines the wafer offset with a significantly improved degree of accuracy. The embodiments of the invention are also described with respect to how sensor data is processed using an optimization program to determine an approximate value of an unknown amount of wafer offset from the desired location. The invention is further described as using the approximated value of the wafer offset to change the target coordinates of a location at which a robot places the wafer in a processing module, for example, wherein the amount of the change is based on the approximated value of the offset calculated using the optimization program. The change is made as the wafer is being carried by the end effector, so that the position at which the wafer is about to be placed is corrected to compensate for the offset.

It will be obvious, however, to one skilled in the art, that the present invention may be practiced without some or all of these specific details. In other instances, well known process operations have not been described in detail in order not to obscure the present invention.

Figure 1:
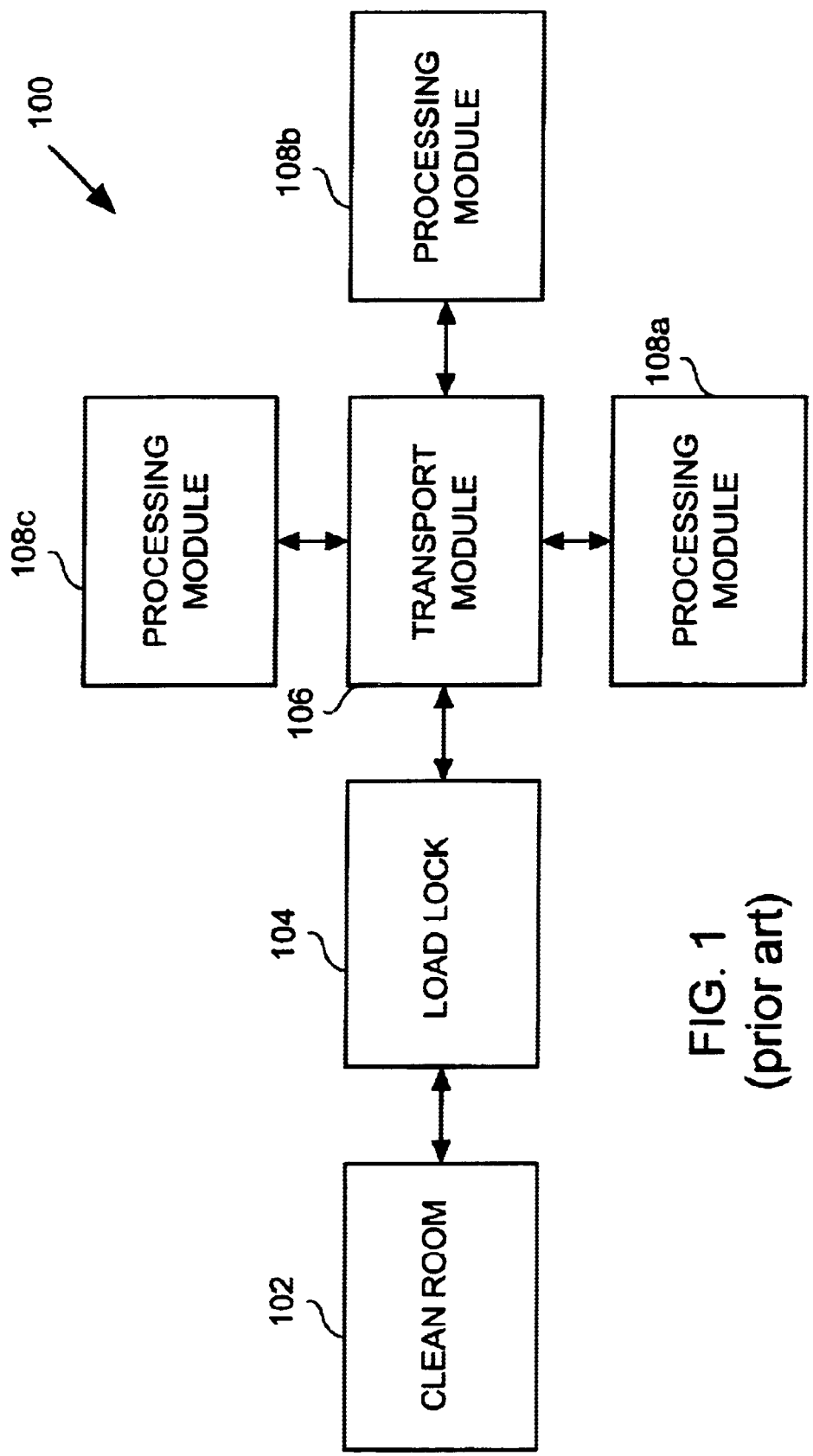
FIG. 1 depicts a typical prior art semiconductor process cluster tool architecture illustrating an atmospheric transfer module that interfaces with a vacuum transport module, wherein a load lock receives wafers for transfer to the vacuum transport module.
Figure 2A:
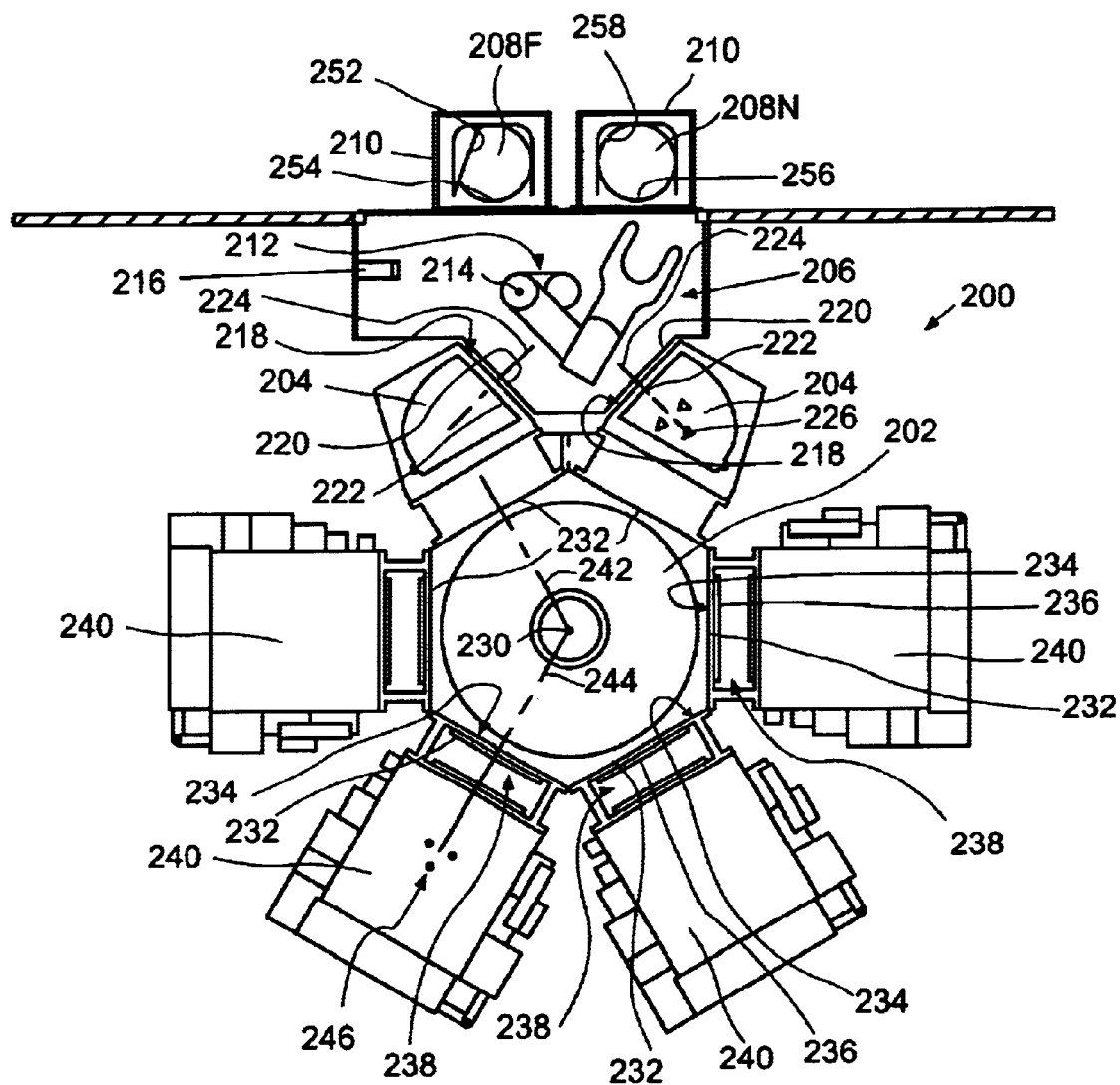
FIG. 2A is a plan view of a semiconductor process cluster tool architecture according to the present invention, illustrating a vacuum transport module robot mounted for rotation on a fixed axis and carrying a blade that transports a wafer into a vacuum processing module.

Referring to FIG. 2A, the invention is generally described as including a semiconductor process cluster tool architecture system 200 having a vacuum transport module 202, at least one load lock 204 (or wafer transport enclosure), and an atmospheric transport module 206 for transferring substrates, or wafers, 208 from one or more cassettes 210 to the load locks 204. Preferably, two adjacent load locks 204 are provided, one at each of two adjacent sides of the vacuum transport module 202. Also, the atmospheric transfer module 206 includes at least two cassettes 210, a front end robot 212 mounted on a fixed axis of rotation 214, and a wafer aligner 216. The aligner 216 is used to find the desired position of the wafer before it is moved into the cluster architecture 200. Each of the load locks 204 has a wafer receiving face 218 provided with a load lock port 220 through which the wafers 208 may be transferred. Each port 220 may be closed by a gate valve, or door, 222. The front end robot 212 transfers the wafers 208 through the ports 220 along a load lock wafer transfer axis 224 that is centrally positioned relative to the port 220 and is perpendicular to the face 218. The front end robot 212 places the wafers 208 on fingers 226 in the load lock 204.

Figure 2B:
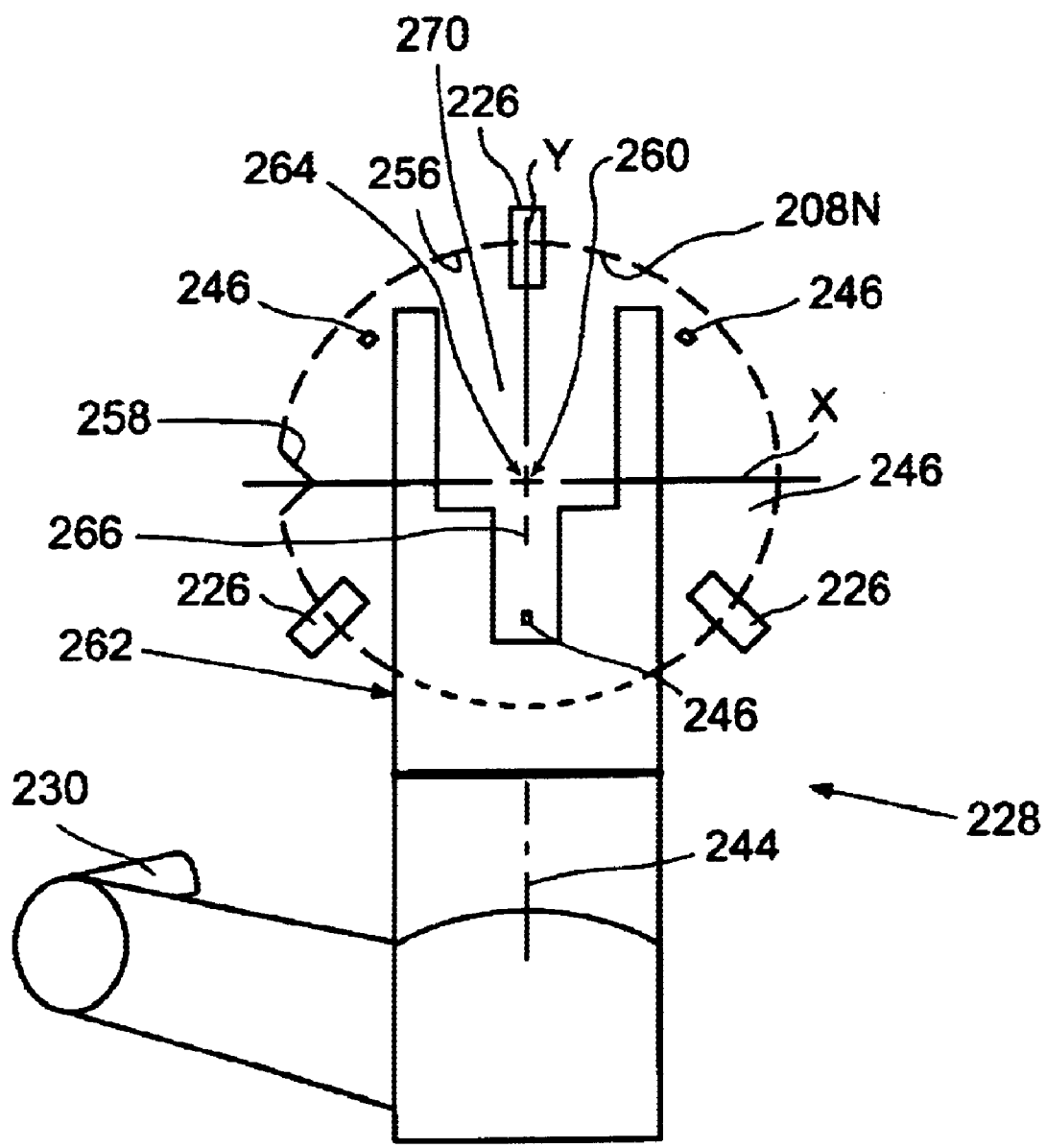
FIG. 2B illustrates a plan view of the blade carrying a wafer properly aligned with the blade.
Figure 2C:
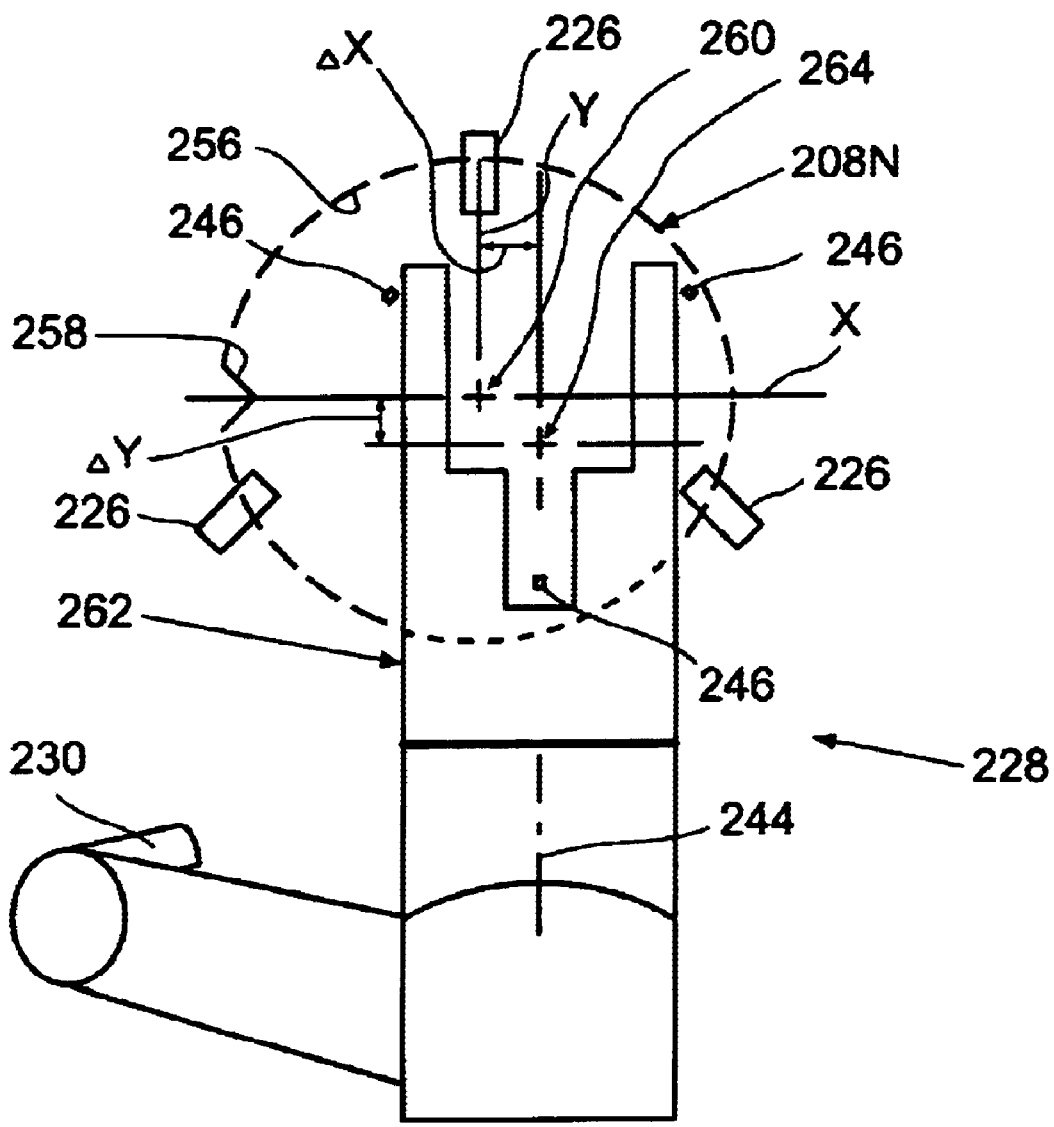
FIG. 2C illustrates a plan view of the blade carrying a wafer improperly aligned with the blade, showing the wafer misalignment that may be determined according to the present invention.

From the load locks 204, the wafers 208 are transferred to the vacuum transport module 202. Referring also to FIGS. 2B and 2C, the module 202 includes a vacuum transfer robot 228 that is installed at a central axis 230. The module 202 has six wafer transfer faces 232, each of which is provided with a port 234 that may be closed by a gate valve, or door, 236 of a dual slot valve 238, for example. Two of the faces 232 are between the load locks 204 and the module 202, whereas an exemplary four of the faces 232 are provided with respect to four respective processing modules or chambers 240.

Considering movement of a wafer 208 from one load lock 204 into one of the processing modules 240, the vacuum transfer robot 228 picks the wafer 208 from the fingers 226 in the load lock 204. In a retract operation the robot 228 moves the picked wafer 208 through the port 234 along an incoming wafer transfer path 242 that is centrally positioned relative to the respective port 234 and is perpendicular to the respective face 232. The vacuum transfer robot 228 moves the wafer 208 into the vacuum transport module 202 on the path 242 and then along a second wafer transfer path 244 that is centrally positioned relative to the respective port 234 and respective face 232 of the processing module 240 that has been identified for processing of the wafer 208. In an extend operation, the robot 228 continues to move the wafer 208 along the second path 244 into and through the port 234 of the identified processing module 240. The robot 228 places the wafer 208 on pins 246 in the identified processing module 240. Upon completion of operations in the processing module 240, the robot 228 picks the wafer 208 from the pins 246. In a retract operation the robot 228 moves the wafer 208 along the second path 244 into and through the port 234 and back into the vacuum transport module 202.

As examples of the types of wafers 208 that may be transported, FIG. 2A shows the cassettes 210 supporting a first wafer 208F that has a flat edge 252 and a curved edge 254 (in the left cassette 210) and a second wafer 208N that has a curved edge 256 provided with a notch 258 (in the right cassette 210). The front end robot 212 picks the appropriate wafer 208F or 208N from one of the cassettes 210 and places the wafer 208 in the wafer aligner 216. The wafer aligner 216 positions the wafer 208 in a selected orientation, as described below. The front end robot 212 then picks the oriented wafer 208 from the aligner 216, transfers the oriented wafer 208F or 208N through the load lock port 220 into the load lock 204, and places the oriented wafer 208 on the fingers 226.

Because of the orienting operation of the aligner 216, as placed on the fingers 226 the oriented wafer 208 has either the flat edge 252 or the notch 258 in one of many desired orientations with respect to a wafer center 260 and X and Y wafer axes that intersect at the wafer center 260. One of those orientations of the wafer 208N is shown in FIG. 2B with the wafer 208N (shown in dashed lines) supported by a blade, or end effector, 262 of the vacuum transport robot 228. The Y wafer axis may be thought of as extending through noon and six o'clock positions of the face of a clock, for example, wherein the wafer center 260 is at the center of the face. With this in mind, the exemplary desired orientation depicts the wafer 208N having been rotated on the wafer center 260 so that the notch 258 is at a nine o'clock position. It may be understood that the desired orientations of each of the wafer 208N and the wafer 208F include having the respective notch 258 at, or flat edge 252 facing, any of the noon, three-o'clock, six o'clock or nine o'clock positions, for example, relative to the wafer center 260.

Different ones of the wafers 208 may also have different physical characteristics other than the flat edge 252 or the notch 258. For example, the cluster tool architecture system 200 is adapted to process wafers 208 having different diameters. Although many different diameter wafers may be processed, the present invention is described with respect to wafers 208 having 200 mm and 300 mm diameters, for example.

For a particular manufacturing situation, there is a particular orientation of the flat edge 252 or of the notch 258 with respect to the wafer center 260. In addition to such orientation, there is an ideal location of the center 260 of the oriented wafer 208 with respect to a blade center 264 of a blade, or end effector, 262. Such ideal location is depicted in FIG. 2B in which the wafer center 260 and the blade center 264 are at the same location, with the Y axis of the wafer 208 co-extensive with a longitudinal axis 266 of the blade 262. The wafer 208 in the ideal location is shown as a disk defined by a dashed circular line in FIG. 2B. However, for reasons including those described above (e.g., electrostatic chuck performance and handling), the wafer 208 is sometimes located on the blade 262 with the wafer center 260 out of alignment with the blade center 264. This out of alignment situation is illustrated in FIG. 2C by the wafer 208N shown by a dashed line. This out of alignment situation corresponds to the "wafer-blade misalignment" and "wafer misalignment" described above. Wafer misalignment is characterized by the wafer center 260 being spaced from the blade center 264. Such spacing may be in one or both of the directions of the X axis or the Y axis of the wafer 208, wherein spacings in both such direction are shown in FIG. 2C, such that the wafer center 260 is to the left by ah amount delta X and up by an amount delta Y from that shown in FIG. 2B.

It may be understood that because the blade 262 carries the wafer 208 to the pins 246 in the processing chamber 240, the location of the center 260 of the wafer 208 need only be determined with respect to the blade center 264 and not with respect to any other equipment of the cluster tool architecture system 200. For example, when a particular wafer 208 is being transported, once a determination is made as to the amount and direction of the wafer misalignment, the robot 228 may control the location of the blade 262, and thus control the position of the particular wafer 208, so as to eliminate the wafer misalignment when the blade 262 places the particular wafer 208 on the pins 246 in the processing module 240. With the wafer misalignment eliminated, accurate processing of the wafer may proceed in the processing module 240.

The blade 262 of the vacuum transport robot 228 is shown in FIG. 2B as being in the vacuum processing module 240. For illustrative purposes, the fingers 226 of the load locks 204 are shown as rectangles superimposed on the depiction of the blade 262. The blade 262 is shaped to avoid contact with the load lock fingers 226 during the picking operation in the load lock 204, and to avoid contact with the wafer support pins 246 of the processing module 240. This shape provides an open space 270 between the pins 246 so that the blade 262 will not interfere with the operations described below for determining whether there is wafer misalignment.

Figure 3B:
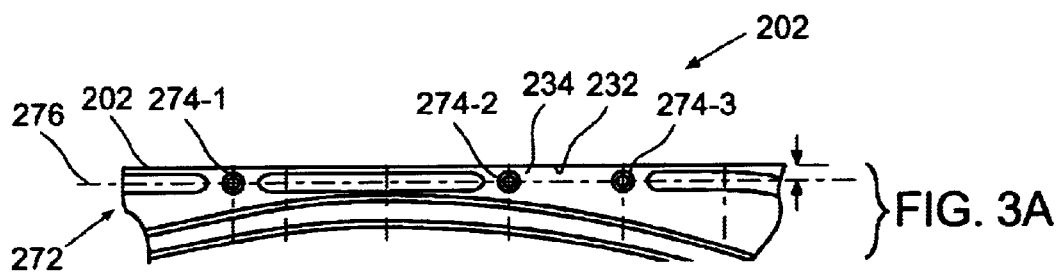
FIG. 3B is a plan view of the wafer having a 200 mm diameter, illustrating times at which the wafer breaks and makes beams of the sensors shown in FIG. 3A.
Figure 3B:
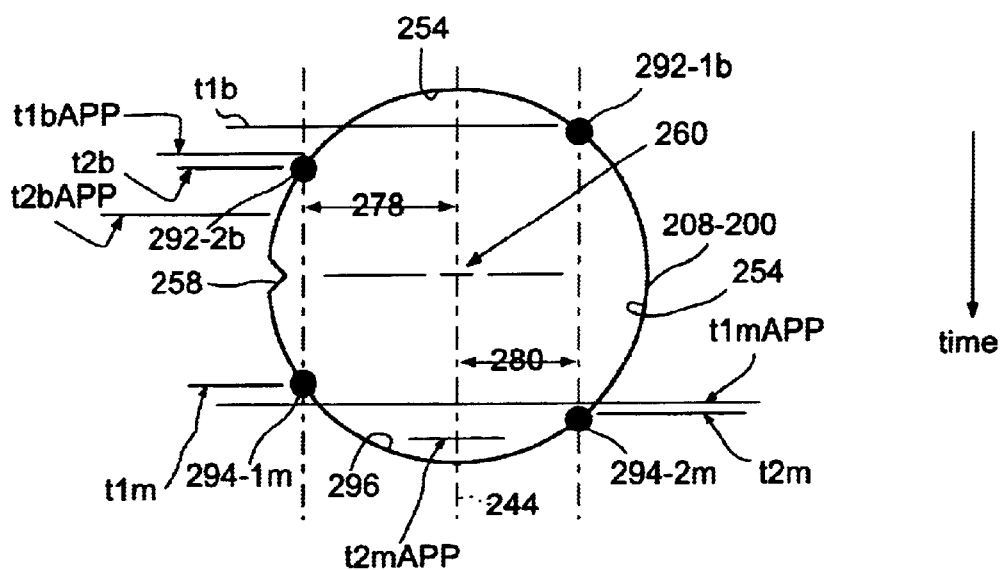
Figure 3C:
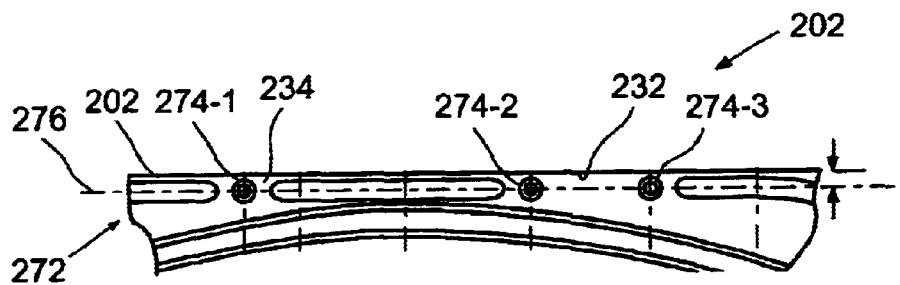
FIG. 3C is a plan view of the same portion of the face of the vacuum transport module of the cluster tool architecture, schematically showing part of the system for dynamic alignment according to the present invention, and showing a third sensor used with a wafer having a 300 mm diameter.

FIGS. 3A and 3C are partial plan views of a face 232 of the vacuum transport module 202, schematically showing part of a system 272 for dynamic alignment according to the present invention. The term "dynamic alignment" is used herein to denote the present apparatus and methods which determine the location of the center 260 of the wafer 208 with respect to the center 264 of the blade 262 as the blade 262 moves the wafer 208 through one of the ports 234 from the vacuum transport module 202 to one of the processing module 240, or through one of the ports 234 from the processing modules 240 into the vacuum transport module 202, for example. For each face 232 and type of wafer 208 having a particular diameter as a selected physical characteristic, the system 272 includes two sensors 274. For a system 272 for wafers 208 having the 200 mm and 300 mm diameters, each face 232 has one sensor 274, identified in FIGS. 3A and 3C as sensor 274-1, and one of two further sensors 274, identified as sensors 274-2 and 274-3.

Figure 3D:
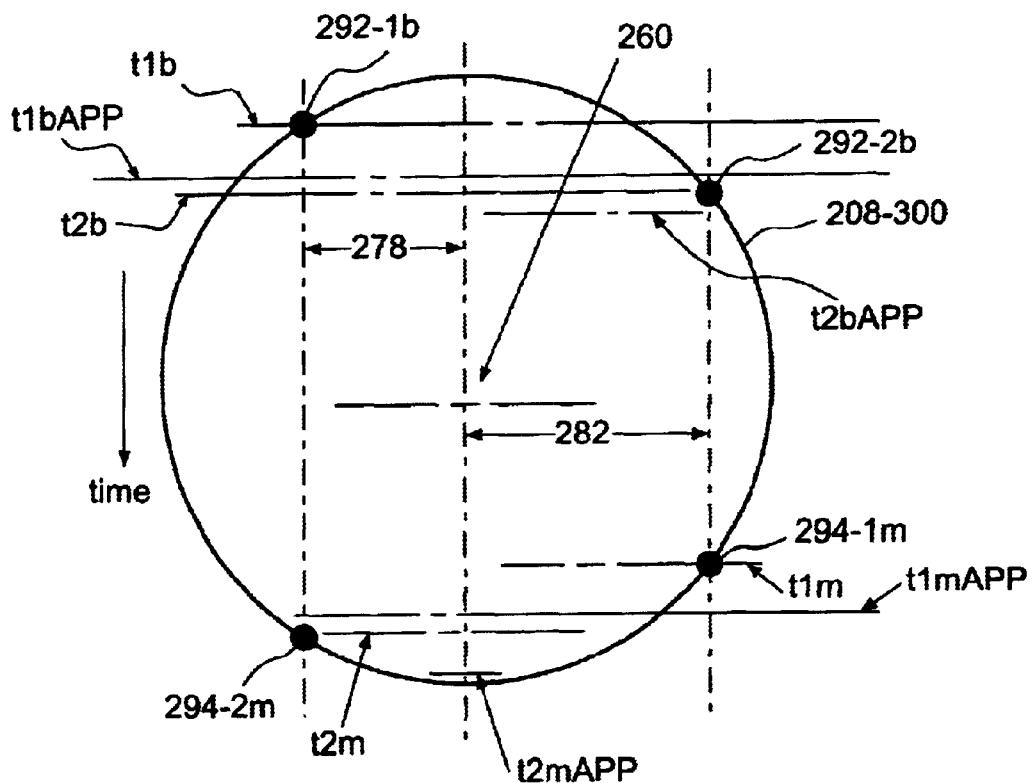
FIG. 3D is a plan view of the wafer having the 300 mm diameter, illustrating times at which the wafer breaks and makes beams of the sensors shown in FIG. 3C.
Figure 3E:
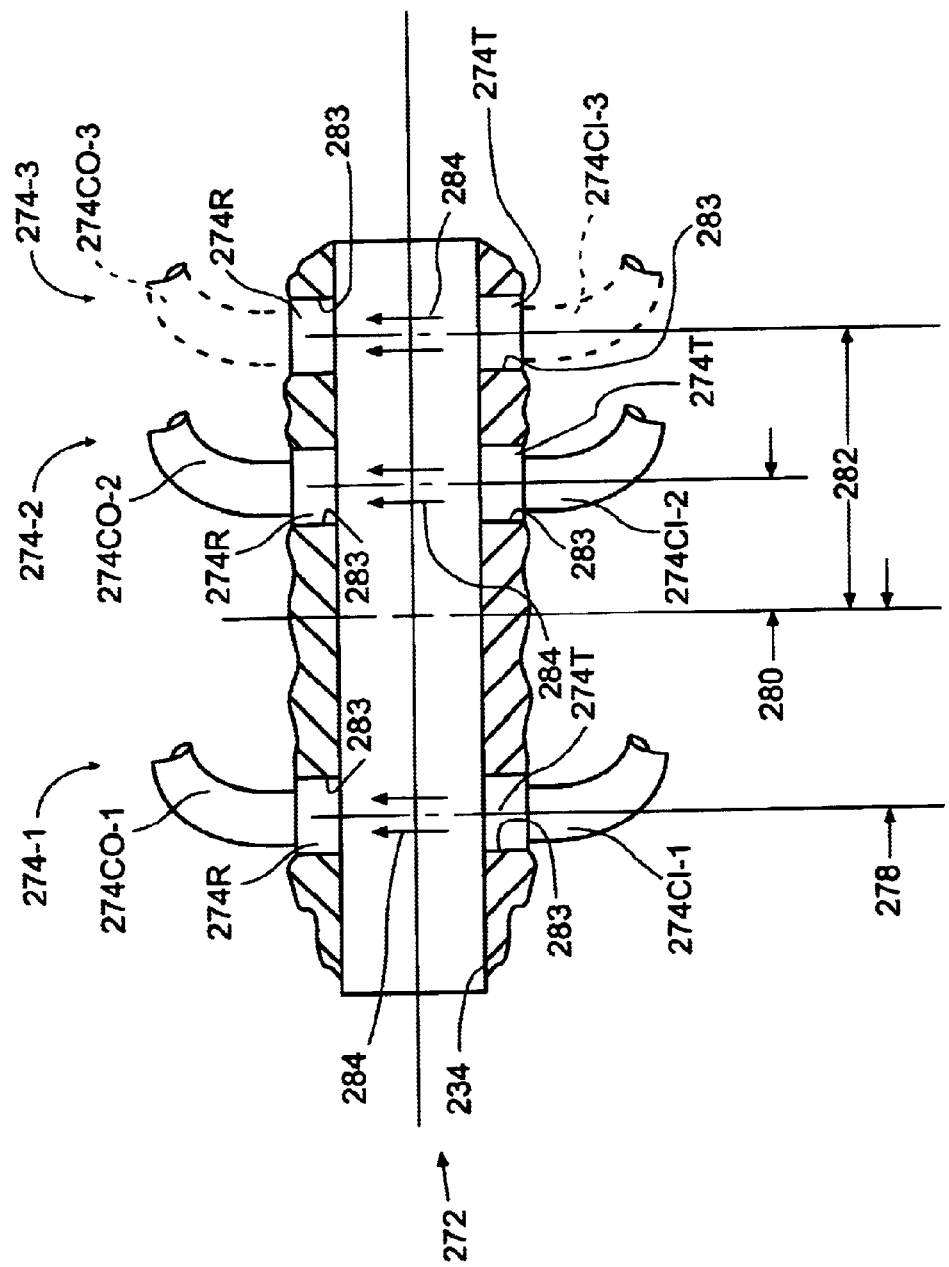
FIG. 3E is an elevational view of a port of one of the faces, showing three sensors which include fiber optic cables for supplying light beams which the wafers break and make.
Figure 3F:
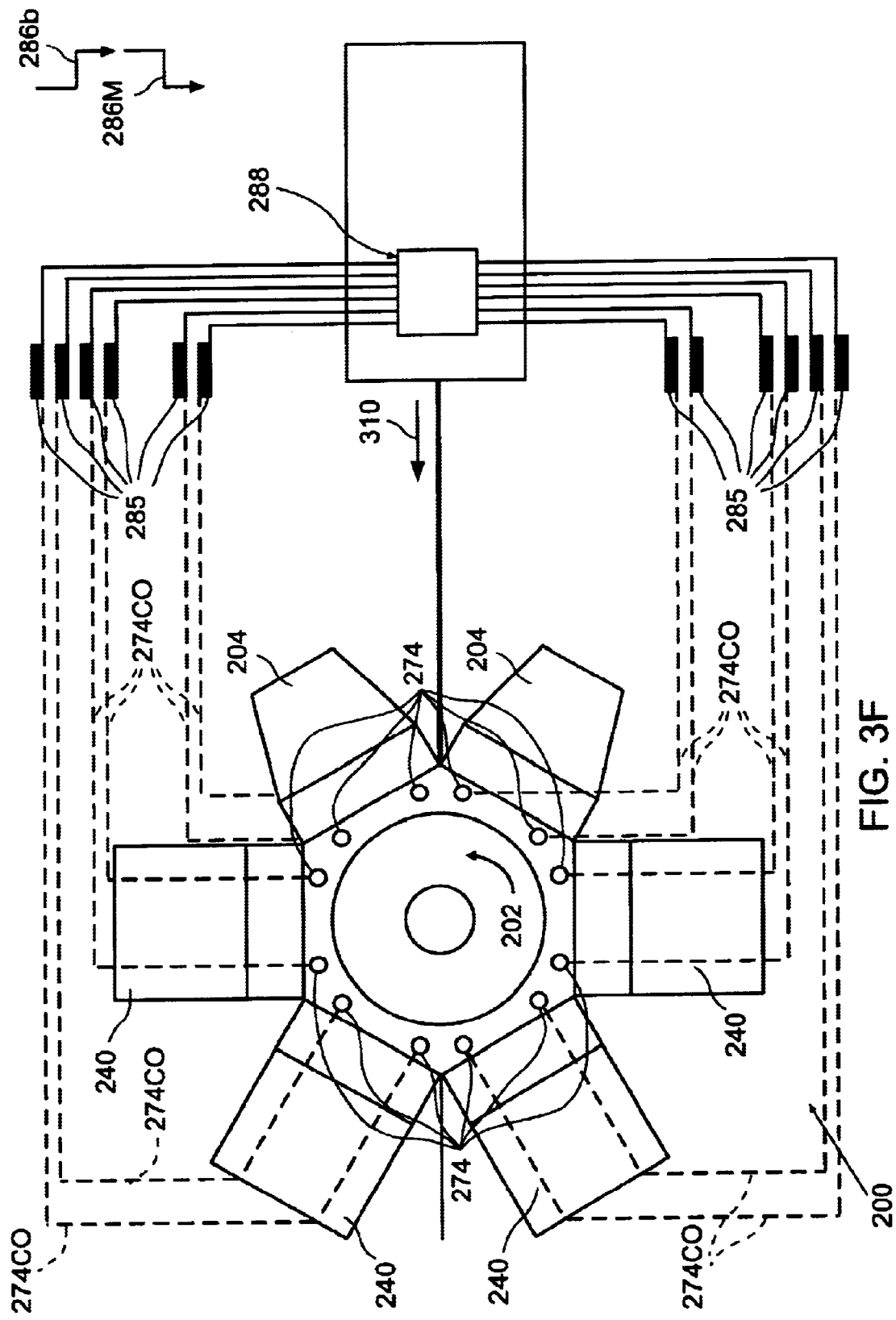
FIG. 3F is a plan view of the cluster tool architecture system showing two of the sensors per face and fiber optic cables connected to beam receivers that generate transition signals for each break and make transition.

For ease of description, FIG. 3F shows only two of the sensors 274 (i.e., the two for a 200 mm diameter wafer 208-200), whereas each of FIGS. 3A, 3C, and 3E shows the three sensors 274-1, 274-2, and 274-3. A first of the sensors 274-1 is mounted in a plane parallel to that defined by the face 232 and on a sensor positioning axis 276 that may be the transverse axis of the port 234 adjacent to that face 232.

FIG. 3B is a plan view of a wafer 208-200 moving through the port 234, showing successive times t1b, t2b, t1m, and t2m at which edges 254 or 296 of the wafer 208 trigger the respective sensors 274-1 or 274-2. FIG. 3B is aligned with FIG. 3A to show that the first sensor 274-1 is spaced from the wafer transport path 244 by a first distance 278. For use with the wafer 208-200, the second sensor 274-2 is also mounted in the plane parallel to that defined by the face 232 and on the sensor positioning axis 276. The second sensor 274-2 is spaced from the wafer transport path 244 by a second distance 280. For use with the 300 mm diameter wafer 208-300, the third sensor 274-3 is mounted in the plane parallel to that defined by the face 232 and on the sensor positioning axis 276. The third sensor 274-3 is spaced form the wafer transport path 244 by a third distance 282.

With such spacings, each of the sensors 274 is in position to sense the respective wafer 208 moving in the path 244 in either the extend operation or the retract operation. The sensing of the wafers 208 by the sensors 274 is shown in FIG. 3E, which is an elevational view of one of the faces 232 showing the port 234 and the sensors 274 spaced along the sensor positioning axis 276. Each sensor 274 is preferably a multi-component, through-beam sensor designed to minimize the number of the most expensive components in each sensor 274. For each sensor 274, the components that determine the location of the sensor 274 include a beam transmitter section 274T below the port 234 and a beam receiver section 274R above the port. Each of the beam transmitter sections 274T is mounted in an aperture 283 machined in the portion of the face 232 around the ports 234. As discussed below, the accuracy of locating the apertures 283 may be relatively low, such as within (±0.050 inches) without reducing the accuracy of the detections of the location of the center 260 of the wafers 208 with respect to the center 264 of the blade 262. The beam transmitter sections 274T receive a light beam 284 from an incoming fiber optic cable 274CI and by use of a lens upwardly direct the light beam 284 across the port 234. FIG. 3E shows one of the beam receiver sections 274R, which includes a lens and an output fiber optic cable 274CO mounted in a corresponding machined aperture 283 above the port 234.

With this background, it may be understood that for ease of illustration in FIG. 3F, the dashed lines identified as "274CO" represent both the input fiber optic cable 274CI and the output fiber optic cable 274CO. It may also be understood that if the location of any of the apertures 283 is not accurately known, then the location of the respective beam transmitter section 274T or the location of the respective beam receiver section 274R received in such aperture 283 will not be accurately known. As a result, the location of the sensor 274 will not be accurately known.

Figure 3G:
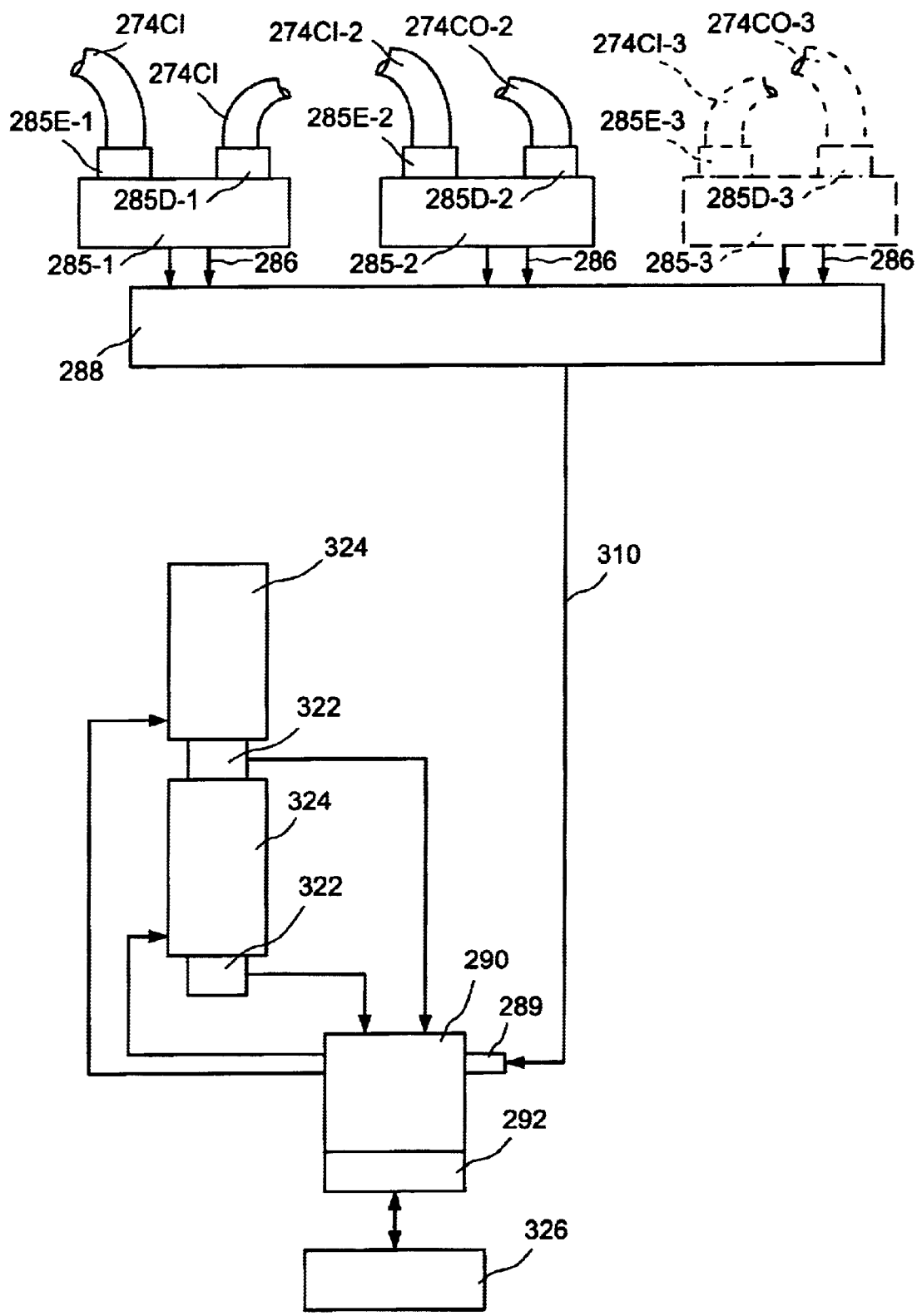
FIG. 3G is a schematic diagram illustrating a card receiving the transition signals and supplying such signals to a robot controller.

FIG. 3G shows that each sensor 274 also includes components in addition to the above sensor location components. One such component is a sensor body 285 having an emitter 285E for supplying the light beam 284 to the respective input fiber optic cable 274CI. The sensor body 285 also includes a light detector 285D that receives the beam 284 from the respective output fiber optic cable 274CO. The detector 285D converts the incoming light beam 284 from the cable 274CO into an analog signal proportional to the intensity of the incoming light beam 284. The analog signal is converted into a digital signal each time the value of the analog signal reaches a threshold level. The digital signal is an output of the sensor body 285 of the sensor 274 and is referred to as a transition signal 286. Before a wafer 208 moves into the port 234, the beam 284 is received by the receiver section 274R, is transmitted to the detector 285D and a steady state condition occurs. FIGS. 3E and 3F schematically show that when the wafer 208 is moved by the blade 262 between the transmitter section 274T and the output fiber optic cable 274CO of the receiver section 274R, the beam 284 of a sensor 274 is broken. At that time, a transition occurs, and the sensor body 285 of the sensor 274 generates the transition signal 286, which in this example is designated 286B to indicate the breaking. In an opposite sense, once the wafer 208 has been moved by the blade 262 between the transmitter section 274T and the receiver section 274R and has broken the beam 284, another steady state condition exists until the blade 262 moves the wafer 208 completely through the port 234 so that the beam 284 is no longer broken. At this juncture, the beam 284 is said to be made, another transition occurs, and that sensor body 285 of the sensor 274 generates another transition signal, indicated in FIG. 3F as 286M to indicate the making. FIGS. 3F and 3G show that the transition signals 286B and 286M are transmitted from the sensor body 285 to a sensor multiplex card 288. The card 288 is connected to an input port 289 of a robot controller 290.

Because the wafers 208 are moving when sensed by the sensors 274, and because the wafers 208 continue to move after being sensed, short response time sensors 274 are preferred. As an example, Banner brand sensors having Model number D12SP6FPY may be used and have a 50 microsecond response time. Also, because there normally are different lengths of fiber optic cable 274CI and 274CO used with the transmitter sections 274T and the receiver sections 274R, each sensor 274 has a different optical distance. Further, there are manufacturing tolerances in the sensors 274. Appropriate sensor gain adjustments are made to compensate for such path lengths and tolerances.

The cost of the system 272 may be reduced by only providing two of the sensor bodies 285 even though there are three sensors 274. In more detail, when the 200 mm diameter wafer 208-200 is to be processed, for the first sensor 274-1 one end of each of the cables 274CI and 274CO may be optically mounted in a respective one of the apertures 283 corresponding to the first sensor 274-1. FIG. 3G shows that the other end of such cables 274CO and 274CI may be optically mounted to the respective emitter 285E-1 and detector 285D-1 of the sensor body 285 (see sensor body 285-1) that corresponds to the first sensor 274-1.

For the second sensor 274-2, one end of each of the cables 274CI and 274CO may be optically mounted in a respective one of the apertures 283 corresponding to the second sensor 274-2. The other end of such cables 274CO and 274CI may be optically mounted to the respective emitter 285E-2 and detector 285D-2 of the sensor body 285 (see sensor body 285-2) that corresponds to the second sensor 274-2. Such cables are identified as 274CI-2 and 274CO-2 to indicate use with the second sensor 274-2.

FIG. 3E shows that when the 300 mm diameter wafer 208-300 is to be processed, the ends of the cables 274CI-2 and 274CO-2 that were used with the apertures 283 of the second sensor 274-2 are moved, or relocated, and are optically mounted in a respective one of the apaches 283 corresponding to the third sensor 274-3 (see cables 274CI-3 and 274CO-3 shown in dashed lines in FIG. 3E). FIG. 3G shows that the other ends of the cables 274CI-2 and 274CO-2 remain optically mounted to the respective emitter 285E-2 and detector 285D-2 of the sensor body 285-2. However, to make it clear that such sensor body 285-2 with the relocated cables 274CI-2 and 274CO-2 functions as a third sensor body, such third sensor body is identified as 285-3 and shown in dashed lines in FIG. 3G. Also, the relocated cables 274CI-2 and 274CO-2 are shown in dashed lines and identified as 274CI-3 and 274CO-3. Also, the emitter 285E-2 connected to the cable 274CI-3 is shown in dashed lines and identified as 285E-3 and the detector 285D-2 connected to the cable 274CO-3 is shown in dashed lines and identified as 285D-3.

As a result of having one sensor body 285 provide these two functions, the number of the substantially higher-cost components (the sensor body 285) is reduced by one for each of the faces 232, such that in a six face architecture system 200 six sensors 274 are rendered unnecessary.

Figure 4A:
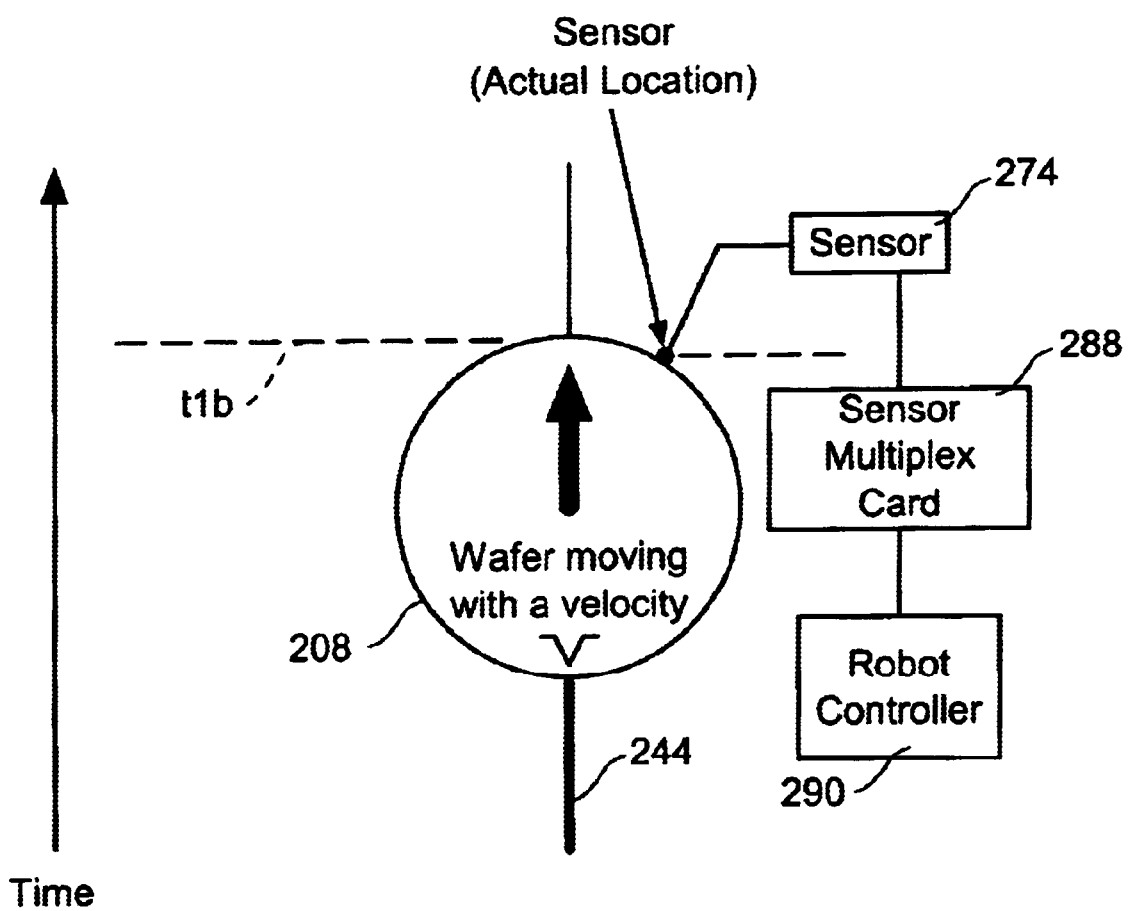
FIGS. 4A and 4B are schematic diagrams showing latency of the sensors and how apparent locations of the sensors are determined to eliminate errors due to such latency.
Figure 4B:
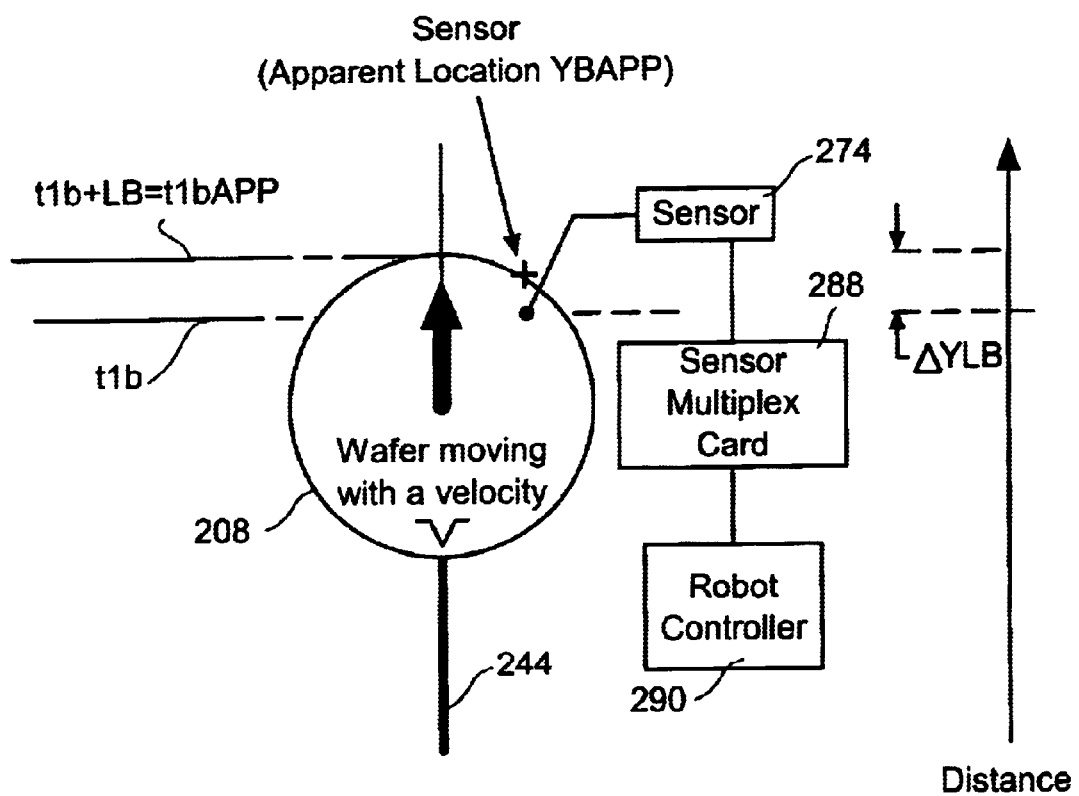

FIGS. 4A and 4B illustrate an effect of each of the sensors 274 having its own unique latency period L, one (LB) for the breaking transition, and one (LM) for the making transition.

FIG. 4A depicts an extend movement of the wafer 208. Such latency period LB is a period of time that starts at a first time t1b at which the beam 284 is broken as the sensor 274 senses the wafer 208 moving in the path 244 through the port 234. Referring to FIG. 4B, the period of time LB ends a later time t1bAPP. By time t1bAPP the transition signal 286B has arrived at the input port 289 of the robot controller 290, and in response to the transition signal 286B the robot controller 290 has stored the data described below as representing the position of the robot 228 in a register 292. The transition signal 286B indicates that the sensor 274 sensed the wafer 208 breaking the beam 284. The "APP" is used in "t1bAPP" to indicate the time of an apparent location of the sensor 274.

In terms of movement of the wafer 208 along the path 244, FIGS. 3B, 3D, 4A and 4B show that the latency period LB, for example, is a finite amount of time delay that exists between the time t1b at which the sensor 274 is "tripped" (in response to the beam 284 being broken) and the time t1bAPP at which such data representing the position of the robot 228 is stored. Since the wafer 208 was moving during the interval of the time delay from time t1b to t1bAPP, at that later time t1bAPP the leading wafer edge 254 or 256 that broke the beam 284 of the sensor 274 will no longer be exactly over the sensor 274. Because the time delay is repeatable and the velocity of the robot blade 262 (and of the wafer 208) are relatively constant over this time delay, the error from this delay may be eliminated. FIG. 4B shows that such elimination is by using, as the location of the sensors 274 for purposes of determination of wafer misalignment in the breaking transition, an apparent location XYBAPP of the sensors 274.

It may be understood that the latency period LM is also a finite amount of time delay that exists between the time t1m at which the sensor 274 is "tripped" (in response to the beam 284 being made) and the time t1mAPP at which such data representing the position of the robot 228 is stored. Since the wafer 208 was moving during the interval of the time delay from time t1m to t1mAPP, at that later time t1mAPP the trailing edge 296 that made the beam 284 of the sensor 274 will no longer be exactly over the sensor 274. Because the time delay is repeatable and the velocity of the robot blade 262 (and of the wafer 208) are relatively constant over this time delay, the error from this delay may also be eliminated. Such elimination is by using, as the location of the sensors 274 for purposes of determination of wafer misalignment in the making transition, an apparent location XYMAPP of the sensors 274.

The apparent location XYBAPP is the position in the Cartesian coordinate system that the sensor 274 would have if the sensor 274 were infinitely fast and if the data representing the robot position was stored in the register 292 at the same time as in the real system (i.e., at time t1bAPP). The apparent location XYMAPP is not shown in FIG. 4B, and is a position in the Cartesian coordinate system that the sensor 274 would have if the sensor 274 were infinitely fast and if the transition signals 286 arrived at the robot controller 290 at the same time as in the real system (i.e., at time t1mAPP).

The calibration process described below is used for determining each of the apparent locations XYBAPP and XYMAPP of the sensors 274, for each of extend and retract operations.

In accordance with the present invention, the respective latency periods LB and LM for each sensor 274 in each of the respective breaking and making transitions are taken into consideration in the selection of the respective values for the distances 278, 280, and 282 for the spacing of the respective sensor 274-1, 274-2, and 274-3 along the axis 276. This is illustrated in the plan views of FIGS. 3B and 3D which respectively show the 200 mm diameter wafer 208-200 and the 300 mm diameter wafer 208-300 moving horizontally (upwardly in FIGS. 3B and 3D, such tat increasing time is measured downwardly). Also, the break and make transition events au: shown by dots 292. For example, dot 292-2b corresponds to the time t2b at which the fast beam 284-1 of the first sensor 274-1 is broken by the edge 254 of the wafer 208-200. The time t1bAPP, representing the end of the latency period LB and the time at which the data representing the robot position is stored in the register 292, is shown occurring before the time t2b of the second break transition represented by dot 292-2b. FIG. 3B shows that the beam 284-2 of the second sensor 274-2 was broken first by the edge 254 of the 200 mm diameter wafer 208-200. When the distances 278 and 280 an non-symmetrical wit respect to the path 244, the data representing the robot position is stoned in the register 292 before the second breaking of the beam (represented by dot 292-2b) which occurs at time t2b.

As an example of the making transition, dot 294-1m corresponds to the time t1m at which the first beam 284-1 of the first sensor 274-1 is first made after a trailing portion 296 of the edge 254 of the wafer 208-200 moves past the first sensor 274-1. The time t1mAPP, representing the end of the latency period LM and the time at which data representing the robot position is stored in the register 292, is shown occurring before the time t2m of the make transition represented by dot 294-2m. In this manner, because the distances 278 and 280 are non-symmetrical with respect to the path 244 the data representing the robot position will be stored before the time t2m of the second making of the beam (represented by dot 294-2m).

FIG. 3D shows a similar situation for the 300 mm diameter wafer 208-300, with the exception that the beam 284-1 of the at sensor 274-1 is broken first at time t1b (dot 292-1b), the beam 284-3 of the that sensor 274-3 is broken next at time t2b (dot 292-2b), the beam of the third sensor 274-3 is then made at time t1m (dot 294-1m), and then the beam 284 of the first sensor 274-1 is made at time t2m (dot 294-2m).

As noted above with respect to FIG. 3F, the vacuum transport module 202 may be used with an exemplary six processing modules 240. Since a wafer 208 may be transported through the port 234 of any of the faces 232 of any of these processing modules 240, the three sensors 274 shown in FIGS. 3A and 3C may be provided on each of those faces 232. Therefore, during any transporting of a wafer 208 it is possible for an output of transition signals 286 to be generated from any of the processing modules 240.

Figure 5:
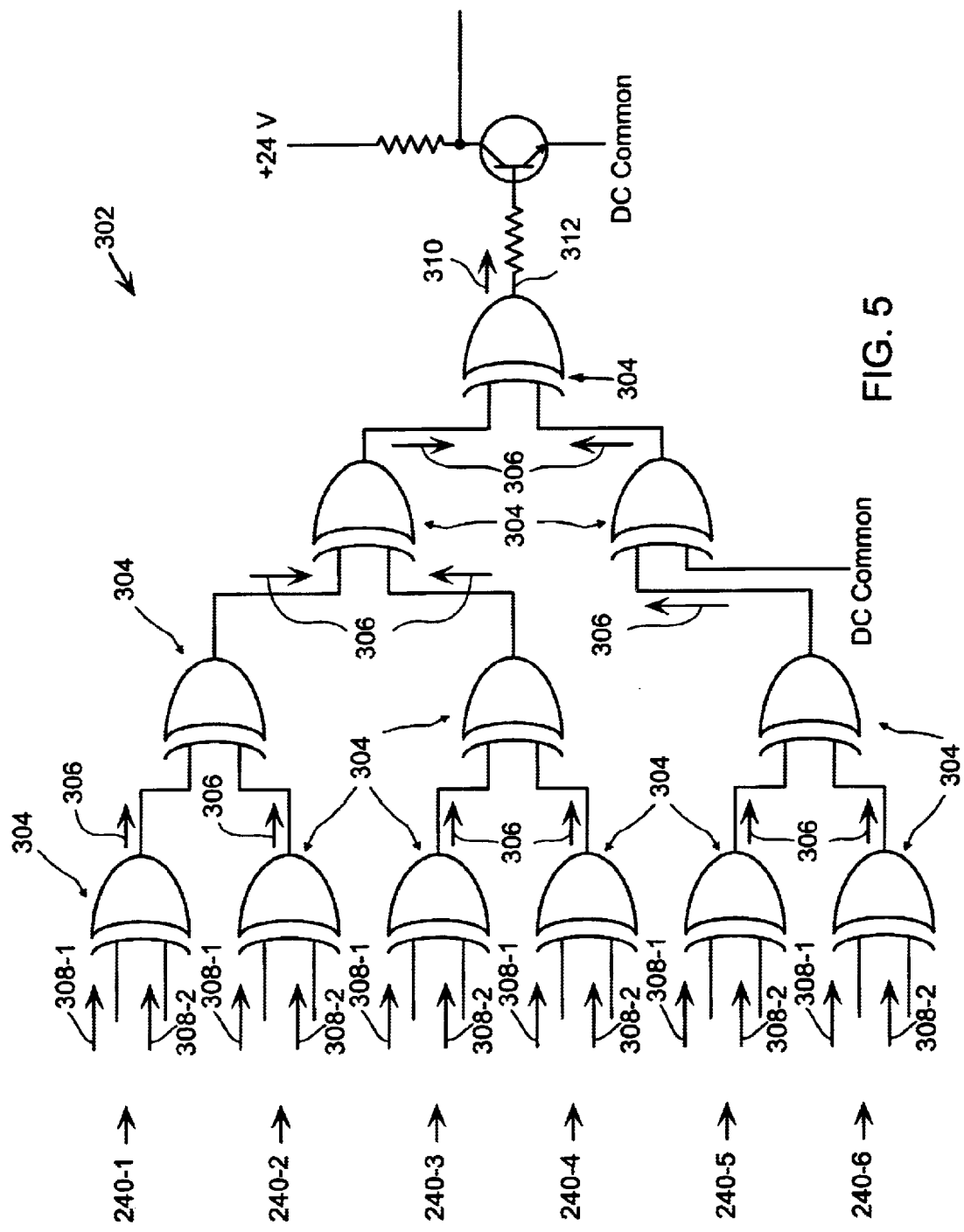
FIG. 5 is a schematic diagram of a logic circuit that provides one output signal per break and one output per make transition of the beams.

FIG. 5 is a schematic diagram of a logic circuit 302 in the form of an array of exclusive-or gates 304. An output 306 of each exclusive-or gate 304 is active if one or the other, but not both, of inputs 308 is active. In different terms, the output 306 is active if the inputs 308 are different. Circuit 302 has six pairs of the inputs 308, representing the outputs of each of the two active sensors 274 of each of the six faces 232 of the exemplary six processing modules 240. One of the inputs 308-1 may correspond to the output of the first sensor 274-1 of a first vacuum module 240-1, whereas another of the inputs 308-2 may correspond to the output of the second sensor 274-2 of that first vacuum module 240-1. In a similar manner, the other inputs 308-1 and 308-2 of the other five modules 240-2 through 240-6 may be provided.

Figure 6A:
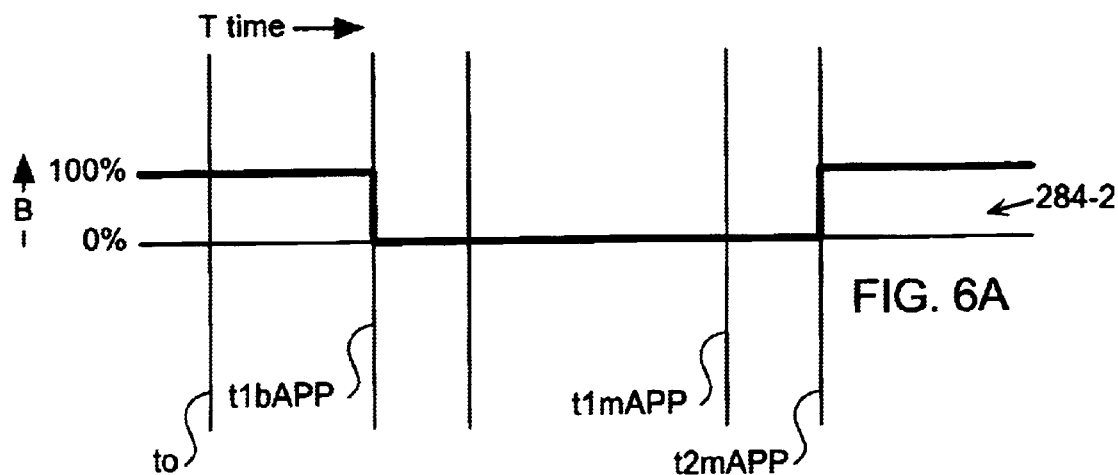
FIGS. 6A, 6B, and 6C respectively relate the timing of the beam break and make transitions for two sensors, to the one output signal from the logic circuit.
Figure 6B:
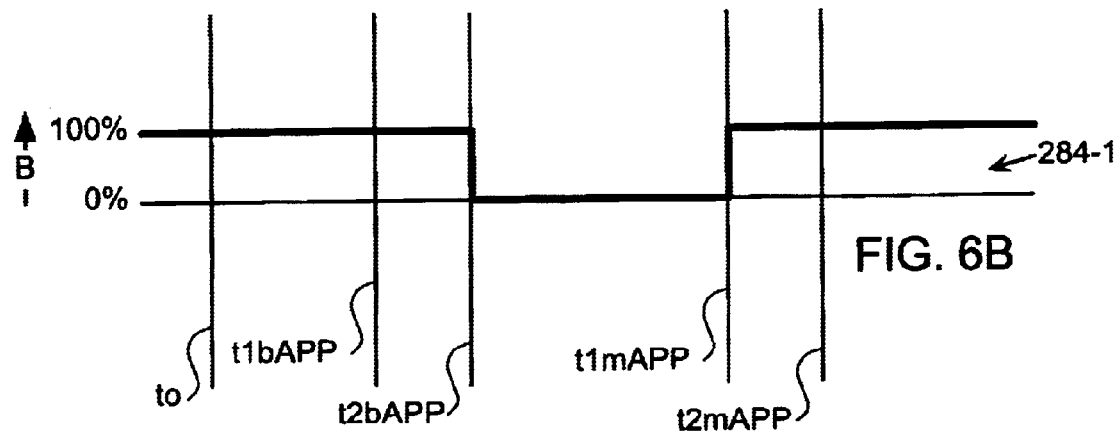
Figure 6C:
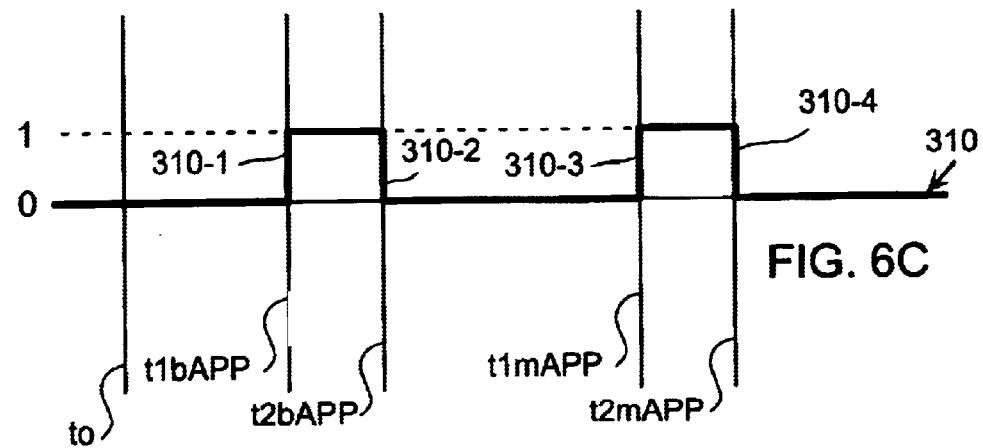

In response to an input transition signal 286 on only one of the inputs 308-1 or 308-2 of only one of the modules 240, a single signal 310 is generated by the logic circuit 302 on a main output 312. FIGS. 6A through 6C show that the single signal 310 transitions from a logical zero to a logical one whenever any of the input sensors 274-1 or 274-2 transitions in either direction. FIGS. 6A and 6B show the times of occurrence of the transitions of the beam 284 upon being broken or made by the moving wafer 208, and after the latency periods L have been eliminated. Depicting the same times, FIG. 6C shows the signal 310 as a binary output from the logic circuit 302 in response to the various transition signals 286 resulting from the breaking or making of the beam 284. In FIGS. 6A and 6B the time during the movement of the wafer 208 is on a T axis (left to right indicates increasing time) and the amount of the beam 284 (zero when blocked, 100% when made) transmitted to the receiver section 274R is shown on a B axis (down to up indicates increasing intensity).

In a typical sequence for determining possible wafer misalignment, at a time to the wafer 208-200 is moving at a controlled velocity toward the port 234 in the path 244. Both of the sensor beam 284-1 and 284-2 are unblocked, such that there is 100% of the respective beam 284-1 and 284-2 received by both of the receiver sections 274R. Further, no transition is indicated, and thus the value of the main signal 310 is logical zero appearing at the main output 312.

At the time t1bAPP (also shown in FIG. 3B) corresponding to the apparent location of the sensor 274-2, there is the beam transition caused by the leading edge 254 of the wafer 208-200 breaking the beam 284-2 of the second sensor 274-2. The beam 284-2 of the second sensor 274-2 is shown in FIG. 6A going to a low intensity, a resulting transition signal 286 goes high (such that one input 308-1 is different from the other input 308-2) and at 310-1 the main output signal 310 goes to a binary one to represent this transition. FIG. 6B shows that the intensity of the beam 284-1 of the first sensor 274-1 continues at 100%. There is no beam 284-1 transition, hence no transition signal 286, and the wafer 208 continues to moving at a controlled velocity.

At time t2bAPP the landing edge 254 of the wafer 208-200 breaks the beam 284-1 of the first sensor 274-1, and there is a beam transition. The beam 284-1 of the first 274-1 is shown going to a low intensity while the intensity of the beam 284-2 of the second sensor 274-2 stays low and the wafer 208-200 continues to move at the uniform velocity. The resulting transition sign 286 from the first sensor 274-1 goes positive. Because there is no transition sensed by the second sensor 274-2, the input 308-2 is different from the input 308-1, such that at 310-2 the main output signal 310 goes oppositely to a binary zero to represent this transition. The intensities of the beams 284-1 and 284-2 of the respective first and second sensors 274-1 and 274-2 continue low, there is no other transition signal 286, and the wafer 208-200 continues to move at the uniform velocity.

Time t1mAPP corresponds to the apparent location YMAPP of the first sensor 274-1 for the make transition. At time t1mPP the trailing edge 296 of the wafer 208-200 makes the beam 2841 of the first sensor 274-1, and there is the resulting beam transition. The resulting transition signal 286 from the first sensor 274-1 is applied to the one input 308-1, causing the main output signal 310 to go oppositely at 310-3 to a binary one to represent this transition. The beam 284-1 of the first sensor 274-1 is shown going to 100% while the intensity of the beam 284-2 of the second sensor 274-2 stays low and the wafer 208 continues to move at the uniform velocity.

Time t2mAPP corresponds to the apparent location YMAPP of the second sensor 274-2 for the make transition. At time t2mAPP the trailing edge 296 of the wafer 208-200 makes the beam 284-2 of the second sensor 274-2, and there is the resulting beam transition. The resulting transition signal 286 from the second sensor 274-2 is applied to the input 308-2, causing the main output signal 310 to go oppositely at 310-4 to a binary zero to represent this transition. The beam 284-2 of the second sensor 274-2 is shown going to 100%, the intensity of the beam 284-1 of the first sensor 274-1 stays at 100% and the wafer 208-200 continues to move at the uniform velocity. At this juncture the movement of the wafer 208-200 for wafer misalignment determination is complete and the system 272 awaits processing of data representing the location of the center 260 of the wafer 208-200 with respect to the center 264 of the blade 262.

Figure 7:
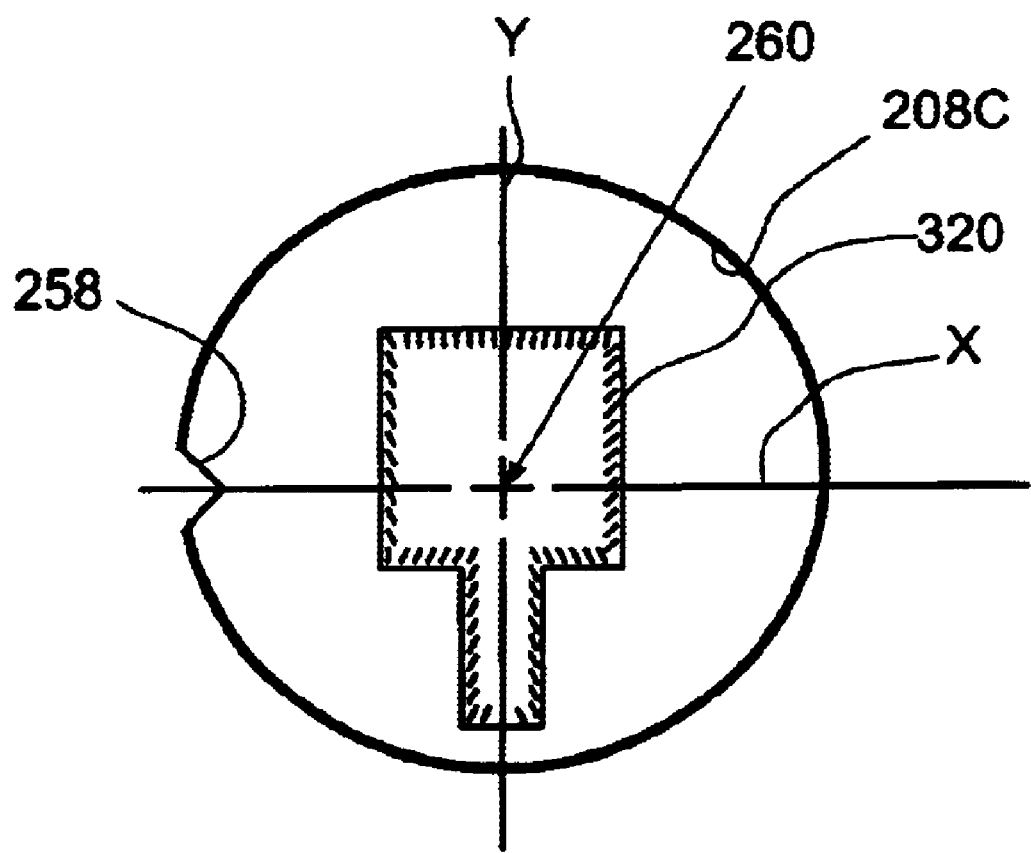
FIG. 7 is a bottom view of a calibration wafer used in a calibration process to accurately determine the location of the sensors.

The main output signal 310 described with respect to FIGS. 5 and 6C is used in conjunction with data as to the precise location of each of the sensors 274 for each of the modules 240. In detail, for every transition 310-1, 310-2, and 310-3 of the main output signal 310 the precise location of each of the sensors 274 is known. This location data is provided by a calibration method using a calibration wafer 208C having known physical characteristics. For example, the calibration wafer 208C shown in FIG. 7 may have a 200 mm diameter and a raised portion 320 on the bottom. The portion 320 is shaped to fit tightly in the open space, or pocket, 270 (FIG. 2B) of the blade 262. Use of the calibration method also assures that certain characteristics of the described apparatus are taken into consideration in providing data as to the precise location of the sensors 274 with respect to the robot 228. For example, the location of the axis 230 of the robot 228 may vary from one module 202 to the next. Also, there may be differences from one module 202 or 240 to the next in the latency periods LB and LM, such that the effective location of a particular sensor 274 in space may be slightly different than the actual location.

The calibration method starts with an operation of identifying whether an extension operation, or a retract operation, is to be performed, and identifying the particular module 240 to be calibrated. Next, there is an operation of clamping the calibration wafer 208C on the blade 262 with the raised portion 320 tightly in the pocket 270. The robot 228 is then given a command to "arm the capture function." This prepares the system 272 for the operation of the sensors 274. In a next operation the robot is commanded to move, as by retracting from the port 234 of the particular module 240 that is being calibrated. During the move, a record data operation records a value of a radius R and an angle Theta (T) based on the transition signals 286 from the sensors 274.

Figure 8:
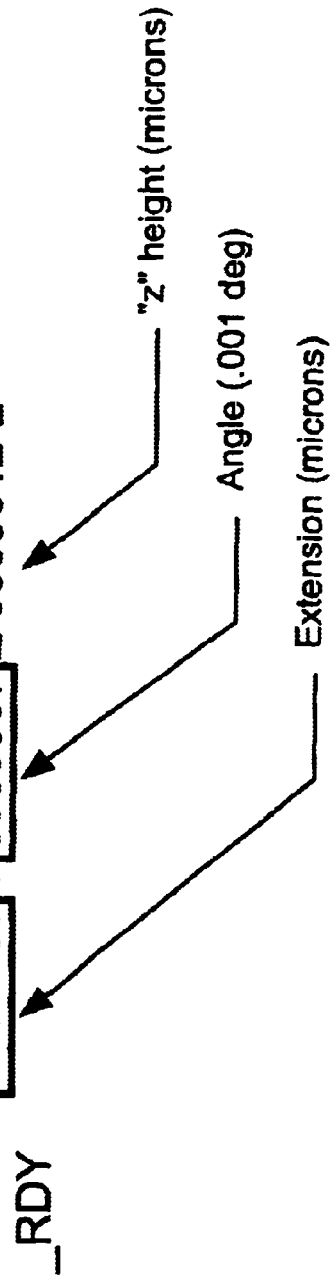
FIG. 8 depicts exemplary data resulting from the calibration process.

Typical values of R and T are shown in FIG. 8 for the retract move. The first three entries in FIG. 8 are not significant because they are not generated in response to the wafer 208C, whereas entries 4 through 7 are significant because they are generated when the wafer 208C passes the sensors 274. The typical data indicates that the height, or "Z" value, of the wafer 208C stays the same since the robot 228 moves the wafer 208C at a constant height. The typical data represents a face 232 of the module 240 similar to FIG. 3B in which the first sensor 274-1 is located at the distance 278 away from the wafer movement path 244, whereas the second sensor 274-2 is located at the distance 280 away from the path 244. The distance 278 is greater than the distance 280, so that as shown in FIG. 3B the second sensor 274-2 generates the first and last transition signals 286 (corresponding to data entries 4 and 7), and the first sensor 274-1 generates the second and third transition signals 286 (corresponding to data entries 5 and 6).

As shown in FIG. 8, the variation in the value of Theta was only 0.005 degrees, which is not significant. Since the variation of the Theta values is small for any normal extension or retraction, the average value is used in the calibration routine. In this example, the average value is 358.940 degrees.

It is to be understood that similar values of R and T are obtained for the extend move, and for efficiency of disclosure are not shown. The first four entries for the extend move are significant because they are generated in response to the wafer 208C passing the sensors 274, whereas the last three entries 5 through 7 are not significant. The typical extend data also indicates that the height, or "Z" value, of the wafer 208C stays the same since the robot 228 moves the wafer 208C at a constant height. The typical extend data also represents a face 232 of the module 240 similar to FIG. 3B in which the first sensor 274-1 is located at the distance 278 away from the wafer movement path 244, whereas the second sensor 274-2 is located at the distance 280 away from the path 244. The distance 278 is greater than the distance 280, so that as shown in FIG. 3B the second sensor 274-2 generates the first and last transition signals 286 (corresponding to data entries 1 and 4), and the first sensor 274-1 generates the second and third transition signals 286 (corresponding to data entries 2 and 3).

Figure 9B:
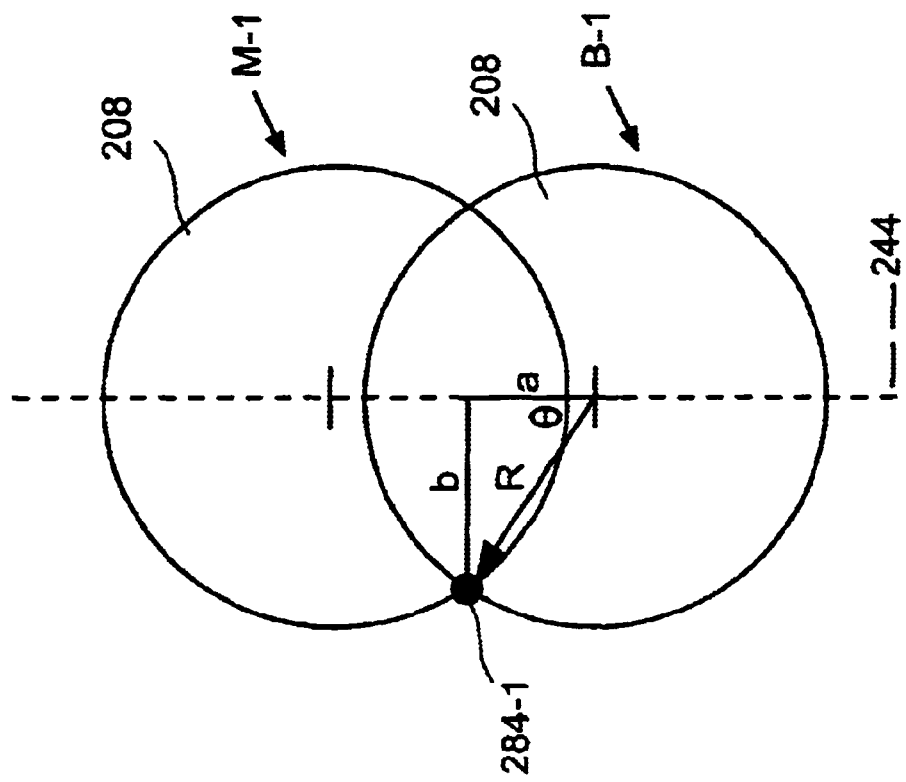
FIGS. 9A and 9B each depict two positions of a wafer during the calibration process, with FIG. 9A showing wafer position relative to a sensor beam that is on the right of a wafer path, and FIG. 9B showing wafer position relative to a sensor beam that is on the left of a wafer path.
Figure 9A:
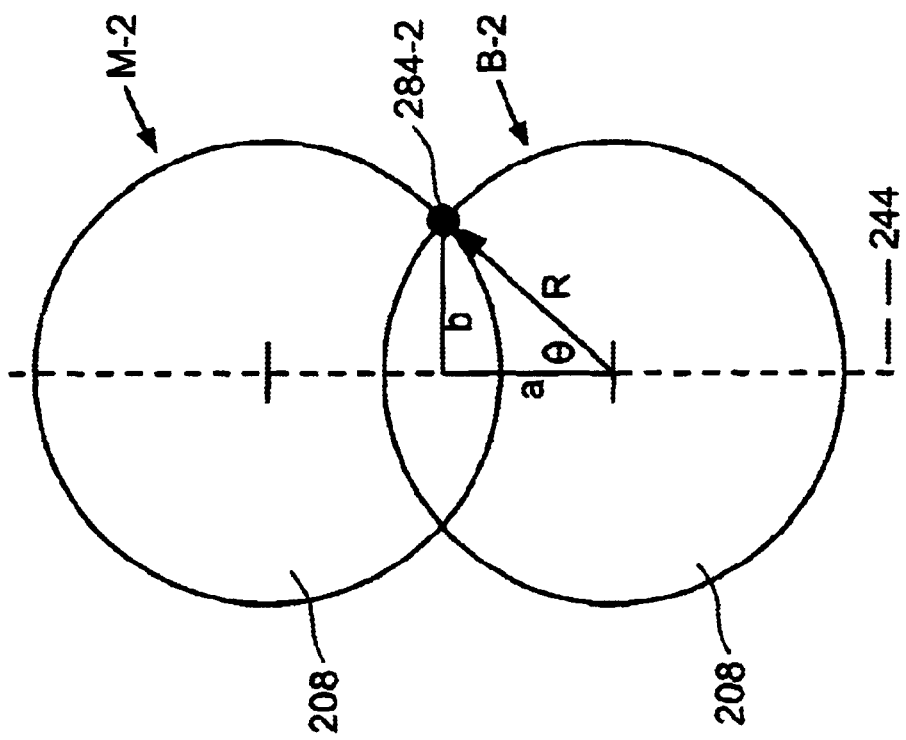

FIGS. 9A and 9B show four portions of the calibration disk 208 along the path 244. In FIG. 9A the wafer 208 in position B-2 is just breaking the beam 284-2 of sensor 274-2. The wafer 208 in position M-2 is just making the beam 284-2 of the sensor 274-2. In FIG. 9B, the wafer 208 in position B-1 is just breaking the beam 284-1 of the sensor 274-1 and in position M-1 is just making the beam 284-1. Thus, FIGS. 9A and 9B show that the respective leading and trailing edges of the wafer 208 cause each beam 284 to transition. This information, along with the knowledge of the wafer radius (R) and the location of the robot 228 when the sensor 274 transitioned, allow the sensor location (center of aperture 283) to be determined. Considering the first and last transition and the data in FIG. 8, the difference between the location of the wafer center 260 when the beam 284 is first broken and when the beam 284 is remade is 513.210–363.106 or 150.104 millimeters (5.9096 in). Referring to FIG. 9A, this distance is 2a. Therefore, the value of a is half the distance between the wafer centers or 2.9548 inches. The value of R is the wafer radius, 100 mm or 3.9370 inches. The distance b to the sensor 274 will be given by $$b = R \sin(\theta)$$

where $$\theta = \cos^{-1}(a/R)$$

Once a and R are known, the sensor location may be expressed as global values. For example, the radius to the sensor location, $R_s$, is given by $$R_s = \sqrt{(R_T+a)^2 + b^2}$$

where $R_T$ is the captured value of the lower wafer position. The angle to the sensor, $\theta_s$, is given by $$\theta_s = \theta_T \pm \tan^{-1}[b/(R_T+a)]$$

where $\theta_T$ is the average angle (theta value) of the path. The ± sign is determined by the side of the path 244 that the sensor 274 is on. If the sensor 274 is on the left the sign is negative. If the sensor 274 is on the right the sign is positive.

The calibration results in accurate determinations of the locations of the sensors 274-1 and 274-2 in polar coordinates for each of the extend and retract movements, and with respect to the polar coordinate system of the robot 228, including the center 264, and for the particular arrangement of sensors 274 (i.e., spacings 278, 280, and 282).

A similar calibration is performed with respect to the third sensor 274-3. As noted, data representing the location of the sensors 274-1, 274-2, and 274-3 is stored in the register 292. With such accurate sensor locations available, each time the signal 310 is output to the robot controller 290 for a transition (e.g., 310-1), the signal 310 indicates the location of one of the edges 254, 256, and 296 of the wafer 208. In response to each such signal 310, the robot controller 290 stores data representing the position of the blade 262 at the time of the transition represented by that signal 310. The blade position data is output by encoders 322 driven by robot motors 324 and is stored in the register 292. Once the wafer alignment movement is complete, the controller 290 transmits the combined data (represented by the sensor locations and the corresponding blade positions) to a system controller 326. The system controller 326 serves as a data processor to provide an indication of the location of the center 260 of the wafer 208 with respect to the center 264 of the blade 262.

It may be understood, then, that the system 272 and the related method provide apparatus and a method of wafer alignment that operates while the wafer 208 is being transported without increasing the wafer transport time, that is, without reducing the controlled velocity, or the rate of transfer, of the wafer 208 among the modules 202 or 240 or the load locks 204. Such method and apparatus reduces the number of data processors per sensor 274 by requiring only one processor (controller 326) for the three sensors 274 at the same face 232. Due to the spacings 278, 280, and 282, and the circuit 302, that one processor is the only processor needed for determination of wafer misalignment in the entire cluster tool architecture 200. By the above-described calibration process, such method and apparatus also require less machining accuracy in locating the apertures 283 for the sensors 274, without sacrificing the accuracy of detections made using the sensors 274. As described, the latency periods LB and LM are also eliminated as sources of errors in using through-beam sensors 274 to make wafer alignment determinations.

Reference is made to Table 1 below, wherein the various data described above is organized for efficiency of description.

TABLE 1

INPUTS FOR PROCESSING
THE OPTIMIZATION PROGRAM

1. Data representing locations of the end effector at times of sensor transitions.
2. Data indicating whether the end effector is moving in an extend or a retract operation.
3 Calibrated sensor position data for the extend operation.
4 Calibrated sensor position data for the retract operation.
5. Data indicating the radius of the wafer.

The data in Table 1, item 1, is described as "representing locations of the end effector at times of sensor transitions." For example, one of such "times of transitions" corresponds to the above-described exemplary time t1bAPP at which the transition signal 286B has arrived at the input port 289 of the robot controller 290. In response to each of the two exemplary transition signals 286B the robot controller 290 stores data in the register 292 representing the position of the robot 228 at the time of the particular transition signal 286B. Similarly, at the time of each of the two exemplary transition signals 286M the robot controller 290 stores data in the register 292 representing the position of the robot 228 at the time of the particular transition signal 286M. Once the wafer alignment movement is complete, the controller 290 transmits the combined data (represented by the sensor locations; and the corresponding blade positions, i.e., the positions of the robot 228 at the time of the transitions) to the system controller 326. The data in Table 1, item 2, is described as "Data indicating whether the end effector is moving in an extend or a retract operation." This data is acquired by knowledge of where the robot is when the motion begins and the target position for the motion.

The data in Table 1, item 3, is described as "Calibrated sensor position data for the extend operation". The data in Table 1, item 4, is described as "Calibrated sensor position data for the retract operation." These data are the data described above as resulting from the calibration of the three sensors 274-1, 274-2, and 274-3 for the respective extend and retract operations. This data representing the location of the sensors 274-1, 274-2, and 274-3 is stored in the register 292 separately for each of the extend and retract operations. With such accurate sensor locations available, each time the signal 310 is output to the robot controller 290 for a transition (e.g., 310-1), the signal 310 indicates the location of one of the edges 254, 256, and 296 of the wafer 208.

The data in Table 1, item 5, is described as "Data indicating the radius of the wafer". This data is derived from the size of the particular wafer 208 that is being handled, i.e., a 200 mm or a 300 mm diameter, for example.

As a preface to describing the determination of an approximate value of an offset of the wafer 208, reference is made to FIG. 2B and the above description of the ideal location of the center 260 of the oriented wafer 208 with respect to a blade center 264 of the blade 262. As shown in FIG. 2B, the wafer center 260 and the blade center 264 are at the same location, with the Y axis of the wafer 208 co-extensive with a longitudinal axis 266 of the blade 262. The wafer 208 in the ideal location is shown as a disk defined by a dashed circular line in FIG. 2B. Such ideal location corresponds to a desired location of the wafer 208 within the load lock 204, or within a processing module 240, for example. Such desired location of the wafer 208 is the one for which the processing module 240, for example, is designed for accurate processing of the wafer 208. The system controller 326 identifies the desired location of the wafer 208 in terms of original target coordinates X and Y of a desired wafer location coordinate system.

For the reasons noted above (e.g., problems with the electrostatic chuck), the wafer 208 is sometimes located within the module 240 or load lock 204 other than at the desired location. As a result, when the robot 228 causes the end effector, or blade, 262 to pick up the wafer 208, the wafer 208 is misaligned on the blade 262. Referring to FIG. 2C, the center 260 of the misaligned wafer 208 is out of alignment with the blade center 264 (see the dashed line in FIG. 2C), which condition is described above as "wafer misalignment". This wafer 208-end effector 262 misalignment is defined by spacing in one or both of the directions of the X axis or the Y axis of the wafer 208 shown in FIG. 2C, such spacing being shown as delta X and delta Y.

With this background in mind, it may be understood that the wafer offset described above may be a situation in which, at the time of pick up of the wafer 208, the wafer 208 is located within the module 240 or load lock 204 other than at the desired location. Such offset results in the above misalignment, which is determined in the retract operation, as described above.

Similarly, for other reasons, during an extend operation in which the wafer 208 is transported (by the end effector 262 under the control of the robot 228) into a next processing module 240, for example, the above-described wafer 208-end effector 262 misalignment may exist. If the wafer 208 is placed into the next processing module 240 without compensating for the misalignment, the wafer 208 will not be placed at the desired location, and processing errors will likely occur. In other words, in terms of the target coordinates X and Y of the desired wafer location coordinate system, the placement of the wafer 208 will have an error e having an "$e_x$" component and an "$e_y$" component. Such misalignment is determined in the extend operation, as described above.

In the case of a misalignment determination during either the retract or the extend operations, there is an intended result of the present determination of the approximate amount of the misalignment during movement of the wafer 208 (e.g., toward the module 240 in which the wafer 208 is to be placed). Such result is that the determination enables the robot 228 to be controlled so as to move the end effector 262 (and the wafer 208 thereon) so as to compensate for (i.e., substantially eliminate) the amount of the determined approximate offset before the wafer 208 reaches the desired location in the module 240. Such compensation is by modifying the original target coordinates to which the end effector 262 and the wafer 208 are nominally moved, to provide modified target coordinates to which the end effector 262 and the wafer 208 are moved in the event of an offset. The modified target coordinates differ from the original target coordinates by an amount approximately equal to the error "e," e.g., including possible ones of the "$e_x$" component and the "$e_y$" component as may have been determined to be part of the above-described misalignment (FIG. 2C). Having provided the modified target coordinates, the robot 228 then places the wafer 208 at the modified target coordinates such that the wafer 208 is placed at substantially the desired location.

Figure 10:
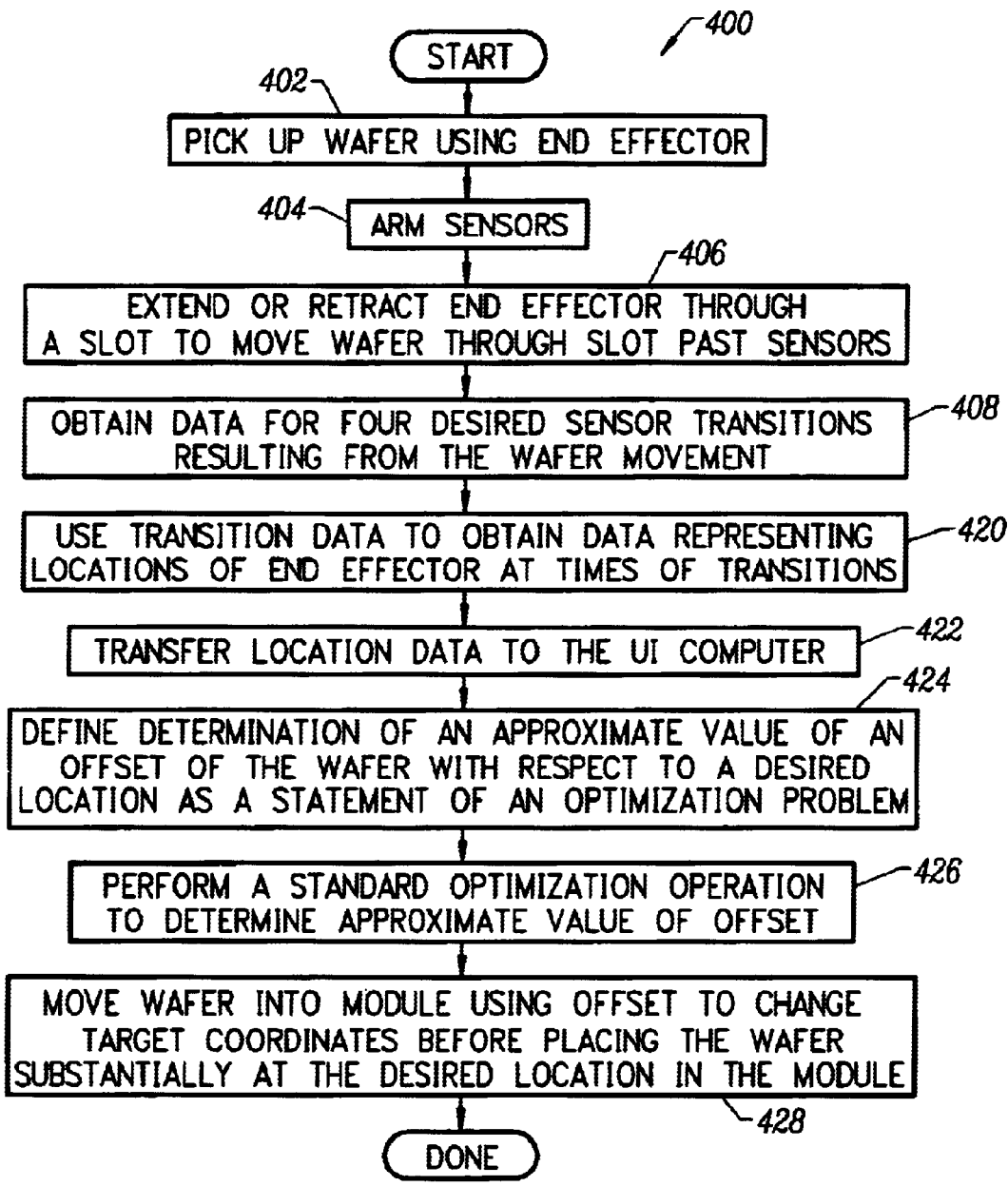
FIG. 10 is a flow chart illustrating operations of the present invention in which dynamic alignment apparatus and methods define, as a statement of an optimization problem, the determination of an approximate value of an offset of the wafer with respect to a desired location of the wafer in a module.

FIG. 10 is a flow chart illustrating operations of a general program 400. The program operates with the dynamic alignment apparatus and methods of the present invention to define, as a statement of an optimization problem, the determination of an approximate value of the offset of the wafer 208 with respect to the desired location of the wafer 208 in the module 108b, for example. In an operation 402, the wafer 208 is picked up using the end effector 262 moved under the control of the robot 228. For descriptive purposes, it is assumed that at the time of this pick up of the wafer 208, the wafer 208 is located within the module 240 or load lock 204 other than at the desired location, i.e., having an offset. Such offset results in the above-described misalignment, which is determined in the retract operation, as described above.

In operation 404 the sensors 274 are armed, which means that the later movement of the wafer 208 past the sensors 274 will be sensed and the resulting transition signals 286 will be processed.

Figure 11:
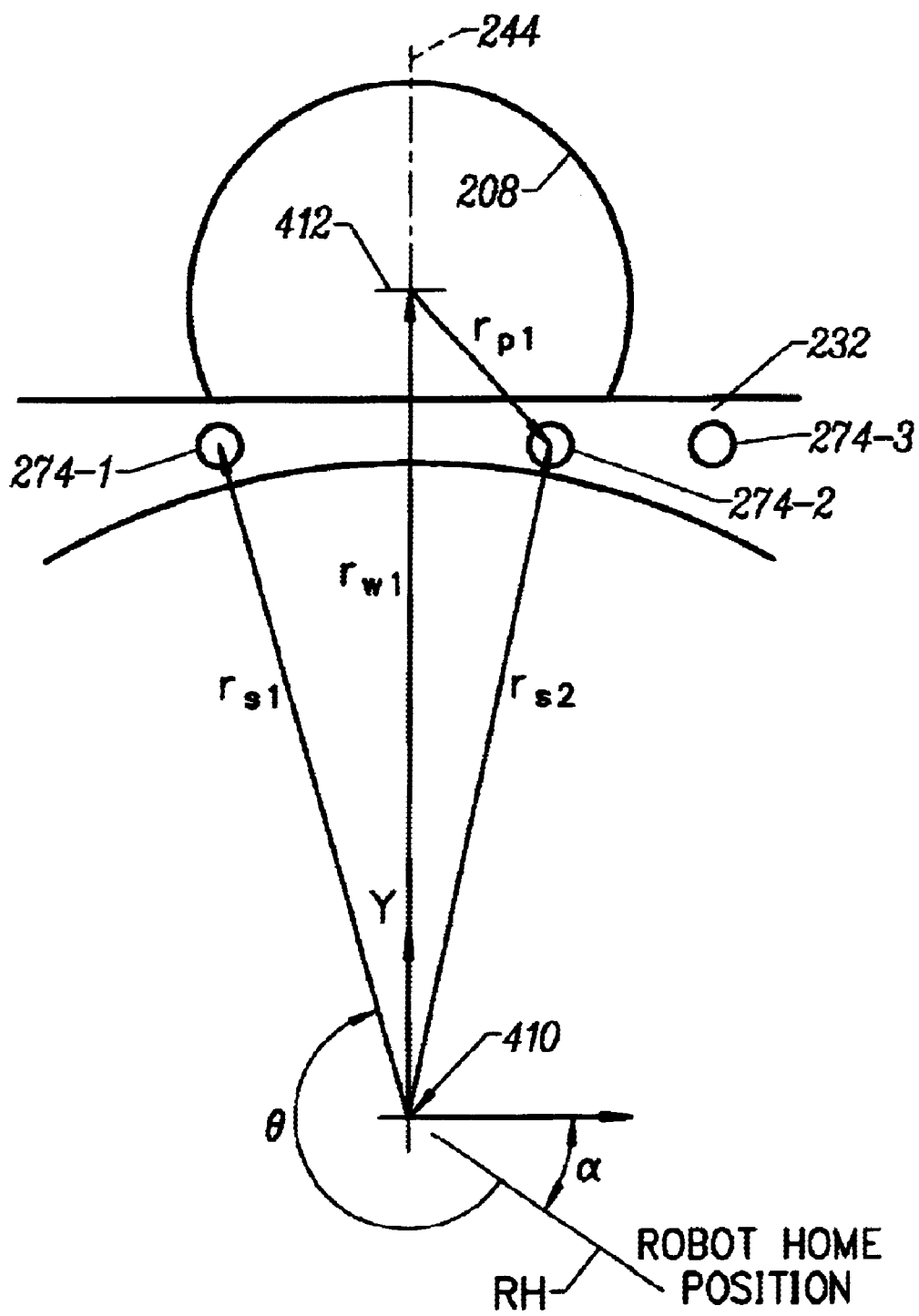
FIG. 11 is a schematic diagram illustrating vectors centered at the rotation center of the robot, and centered at the center of the wafer as the wafer is moved relative to the sensors.

In operation 406 the robot 228 is operated so that the end effector 262 is, as appropriate, extended or retracted through the port 234 and past the two sensors 274 that are operative according to the diameter of the wafer 208. This movement of the wafer 208 relative to the sensors 274 is followed by operation 408 in which two transition signals 286B and two transitions signals 286M will be obtained as data for processing. In more detail, FIG. 11 is a schematic diagram illustrating vectors "$r_{s1}$," "$r_{s2}$", and "$r_{w1}$," each of which has a center 410 indicated by the intersection of X and Y axes. The center 410 and these axes X and Y define a global robot coordinate system. A robot home position (see line RH) is indicated at an angle alpha from the X axis. FIG. 11 also shows a vector "$r_{p1}$" centered at the desired location of the wafer 208 on the blade center 412 as the wafer 208 is moved relative to the sensors 274 along the axis 244 and through the port 234. FIG. 11 also shows the three sensors 274-1, 274-2, and 274-3 installed in one of the faces 232. Based on the illustrated diameter of the wafer 208, only the two sensors 274-1 and 274-2 are operative in this example. Operation 420 uses the data based on the transition signals 286B and 286M to obtain data representing locations of the end effector 262 at the times of the transitions. As described above, the movement of the wafer 208 through the port 234 causes four transitions of the sensors 274-1 and 274-2. Data representing the location of the sensors 274-1, 274-2, and 274-3 has been stored in the register 292. With such accurate sensor locations available, each time the signal 310 is output to the robot controller 290 for a transition (e.g., 310-1), the signal 310 indicates the location of one of the edges 254, 256, and 296 of the wafer 208. In response to each such signal 310, the robot controller 290 stores data representing the position of the end effector 262 at the time of the transition represented by that signal 310. The operation 420 is completed when the end effector position data (output by the encoders 322 driven by robot motors 324) is stored in the register 292.

In operation 422 the wafer alignment movement is complete, and the controller 290 transmits the combined data (represented by the sensor locations and the corresponding end effector positions) to the system controller 326. As noted above, the system controller 326 serves as the data processor, and operates to provide the processing discussed below.

Operation 424 defines, as a statement of an optimization problem, the determination of an approximate value of the offset of the wafer 208 with respect to the desired location in the processing module, for example. This statement of the optimization problem is by way of the following equation (1):

$$F = \sum_{i=1}^{4} \left[ R - \sqrt{(r_{pix} - e_x)^2 + (r_{piy} - e_y)^2} \right]^2$$

The symbols included in equation (1) will be described below.

In operation 426 a standard optimization operation is performed to determine an approximate value of the offset of the wafer 208. The details of operation 426 are set forth in FIGS. 12A and 12B described below.

In operation 428 the wafer 208 is moved by the end effector 262. During the move the offset obtained in operation 426 is used to modify the original target coordinates of end effector 262, which provides the modified target coordinates. The modified target coordinates differ from the original target coordinates by an amount approximately equal to an error "e". The error "e" has components "$e_x$", and "$e_y$," which are set forth in equation (1) above. This provision of the modified target coordinates occurs without decreasing the rate of movement of the wafer 208 through the port 234 or further into the processing module 240, for example, such that as soon as the robot 228 positions the wafer 208 at the modified target coordinates, the wafer 208 is immediately placed at substantially the desired location and the general program 400 is done.

Figure 12A:
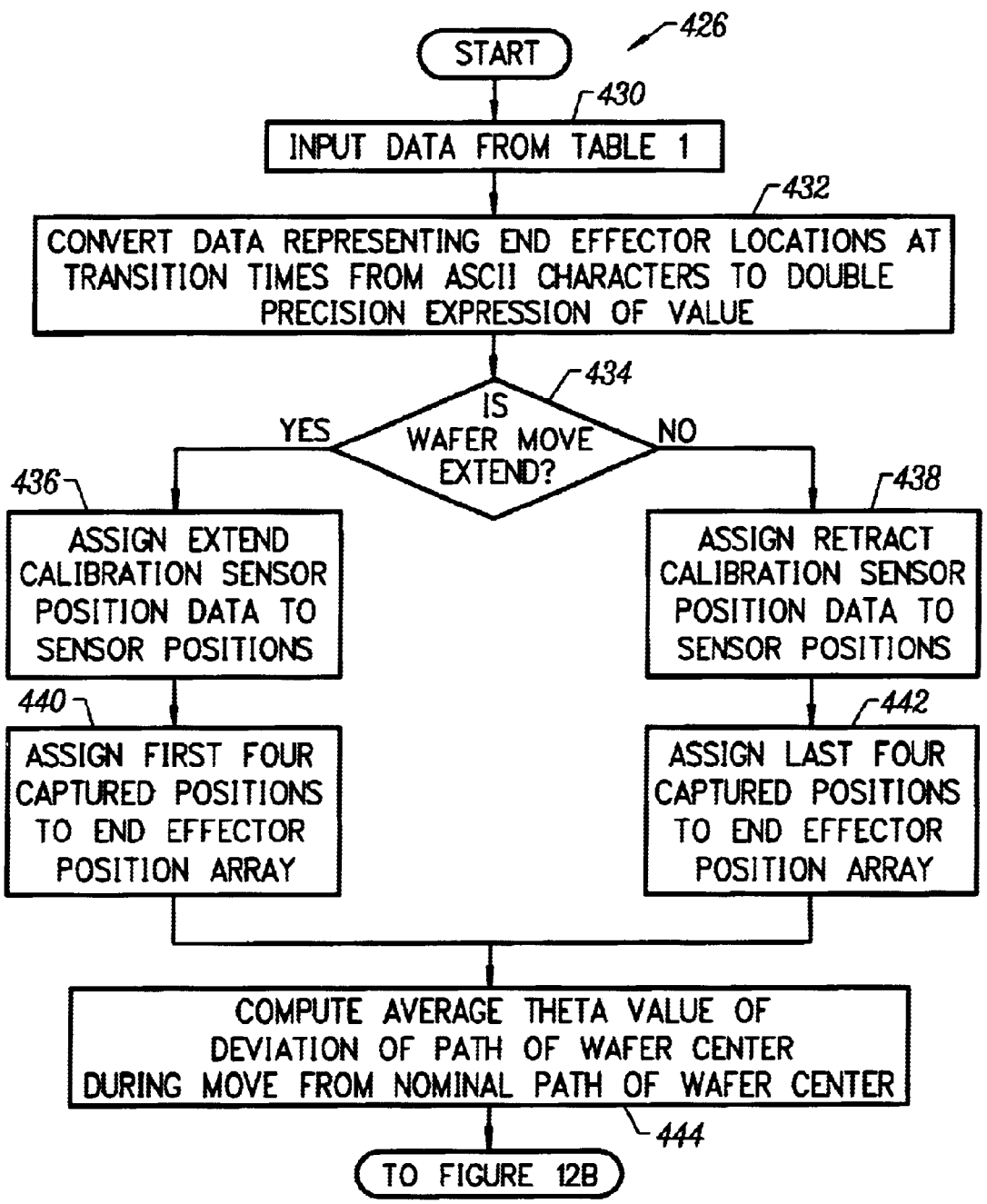
FIGS. 12A and 12B, when combined, are a flow chart illustrating the present invention in which operations process sensor trigger data and calibrated sensor position data for use in calculations for solving the optimization problem.
Figure 12B:
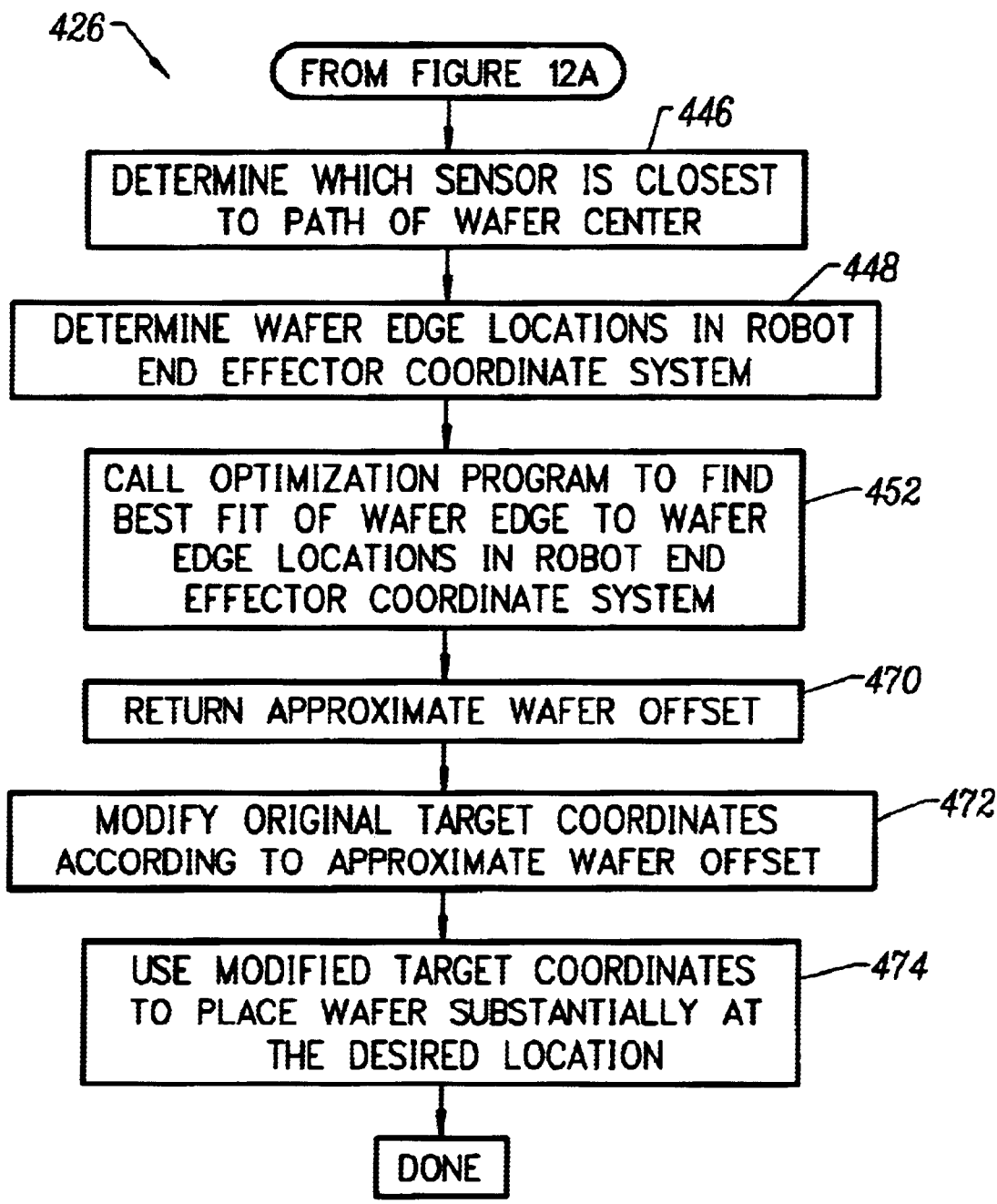

FIGS. 12A and 12B, when combined, depict a flow chart illustrating suboperations of operation 426 for processing the data from Table 1, including sensor trigger data and calibrated sensor position data, in calculating a solution of the optimization problem. In suboperation 430, the above data from Table 1 is input to the system controller, or processor, 326. Operation 426 then moves to suboperation 432 in which the data input from Table 1, item 1, is converted from ASCII characters to a double precision numerical expression of the value. Operation 426 then moves to suboperation 434 at which a decision is made as to whether the wafer move is an extend operation. This decision is based on examination of the data from Table 1, item 2. If the decision is that the wafer move operation is an extend operation, the operation moves to suboperation 436, otherwise the operation moves to suboperation 438. Operation 426 then moves to the appropriate one of suboperations 436 and 438, in which Table 1, item 3 or item 4 data, respectively, is read for use in further processing.

Operation 426 then moves to the appropriate one of suboperations 440 and 442 according to whether the extend or retract operation is currently being performed. Referring to FIG. 8 with respect to suboperation 442 (retract) as an example, the last four captured positions are shown in the rectangles to indicate assigning those four positions to the end effector position array, which defines the four vectors "$r_{w1}$", "$r_{w2}$", "$r_{w3}$", and "$r_{w4}$". A similar assignment is made for the extend operation, but the first four captured positions shown in FIG. 8 are assigned to the end effector position array.

In the event that either of suboperation 440 or 442 is performed, operation 426 then moves to suboperation 444. As shown in FIG. 11, for each of the four sensor transitions (corresponding to the four captured positions in FIG. 8), the estimated wafer center 412 is given by the vector $r_{wi}$. The vector $r_{wi}$ is stored in the robot register 292 as a length and an angle θ measured clockwise from the robot home position RH. At this time the vectors $r_{wi}$ are transferred from the robot register 292 to the computer 326. Of the two sensors 274-1 and 274-2 that are used for the illustrated particular diameter wafer 208, one sensor is closer to the path 244 that the wafer center 412 takes (see sensor 274-2 in this example) and the other sensor is further away from the wafer center 412 (see sensor 274-1). Each sensor 274 is located in space with a vector "$r_{sj}$." As described above, the location of the sensors 274 has been determined through the above-described calibration procedure, and the data resulting from that procedure is input from Table 1, items 3 and 4. In FIG. 11 the sensor 274-2 is shown closest to the wafer center 412 and will be the first to be broken and the last to be established again after the wafer 208 has passed through the port 234. As a different example, if sensor 274-1 number 1 is the closest to the center 412, the following respective equations (2), (3), (4), and (5) may be written:

$r_{p1} = r_{s1} - r_{w1}$ $r_{p2} = r_{s2} - r_{w2}$ $r_{p3} = r_{s2} - r_{w3}$ $r_{p4} = r_{s1} - r_{w4}$

The values of the vectors $r_{sj}$ and $r_{wi}$ are known as a magnitude and angle from the robot home position RH.

Considering the vector "$r_{wi}$," the operation 426 moves to suboperation 444 which determines the nominal path of the wafer center 412. Since the robot 228 moves in either an extend or a retract mode, the wafer center 412 should follow a straight line (e.g., lines 244) that extends radially from the center 410 of the transfer module 206 through the face 232. All of the vectors "$r_{wi}$," therefore, should have the same angle from the robot home position RH. Because of the action of the robot servo (not shown), however, there will be a small variation about this straight line 244. Since the variation is very small, it is assumed to be negligible and an average value is used. The angle to the nominal path 244 of the wafer center 412 is given by equation (6) as follows:

$$\theta_{wavg} = \frac{\sum_{i=1}^{4} \theta_{wi}}{4}$$

where $\theta_{wi}$ is the angle from the robot home position RH to the nominal wafer center 412. The angle $\theta_{wavg}$ is stored in the computer 326.

Operation 426 then moves to suboperation 446 (FIG. 12B) to define the sensor 274 that is closest to the path 244 of the nominal wafer center 412. Suboperation 446 first defines the angles between the path 244 of the nominal wafer center 412 and each of the vectors "$r_{sj}$" that locate the sensors 274. These angles are given by respective equations (7) and (8) as follows:

$$\theta_1 = \theta_{wavg} - \theta_{s1}$$

$$\theta_2 = \theta_{wavg} - \theta_{s2}$$

where $\theta_{s1}$ and $\theta_{s2}$ are the angles to the sensor location vectors $r_{sj}$ from the robot home position RH. The smaller of these two angles determines the sensor 274 that is closest to the path of the nominal wafer center 412.

Operation 426 then moves to suboperation 448 to determine the wafer edge locations in a robot end effector coordinate system that is centered on the center 412 as defined in FIG. 11. Suboperation 448 uses the defined angles $\theta_1$ and $\theta_2$ according to which of the angles is smaller. If $\theta_1 < \theta_2$, the conversions represented by the following respective equations (9), (10), (11), (12), (13), (14), (15), and (16) are used:

$$r_{p1x} = -r_{s1} \sin(\theta_1)$$

$$r_{p1y} = r_{s1} \cos(\theta_1) - r_{w1}$$

$$r_{p2x} = r_{s2} \sin(\theta_2)$$

$$r_{p2y} = r_{s2} \cos(\theta_2) - r_{w2}$$

$$r_{p3x} = r_{s2} \sin(\theta_{23})$$

$$r_{p3y} = r_{s2} \cos(\theta_2) - r_{w3}$$

$$r_{p4x} = -r_{s1} \sin(\theta_1)$$

$$r_{p4y} = r_{s1} \cos(\theta_1) - r_{w4}$$

If $\theta_2 < \theta_1$, the conversions represented by the following respective equations (17), (18), (19), (20), (21), (22), (23), and (24) are used:

$$r_{p1x} = -r_{s2} \sin(\theta_1)$$

$$r_{p1y} = r_{s2} \cos(\theta_1) - r_{w1}$$

$$r_{p2x} = r_{s1} \sin(\theta_2)$$

$$r_{p2y} = r_{s1} \cos(\theta_2) - r_{w2}$$

$$r_{p3x} = r_{s1} \sin(\theta_{23})$$

$$r_{p3y} = r_{s1} \cos(\theta_2) - r_{w3}$$

$$r_{p4x} = -r_{s2} \sin(\theta_1)$$

$$r_{p4y} = r_{s2} \cos(\theta_1) - r_{w4}$$

Figure 13:
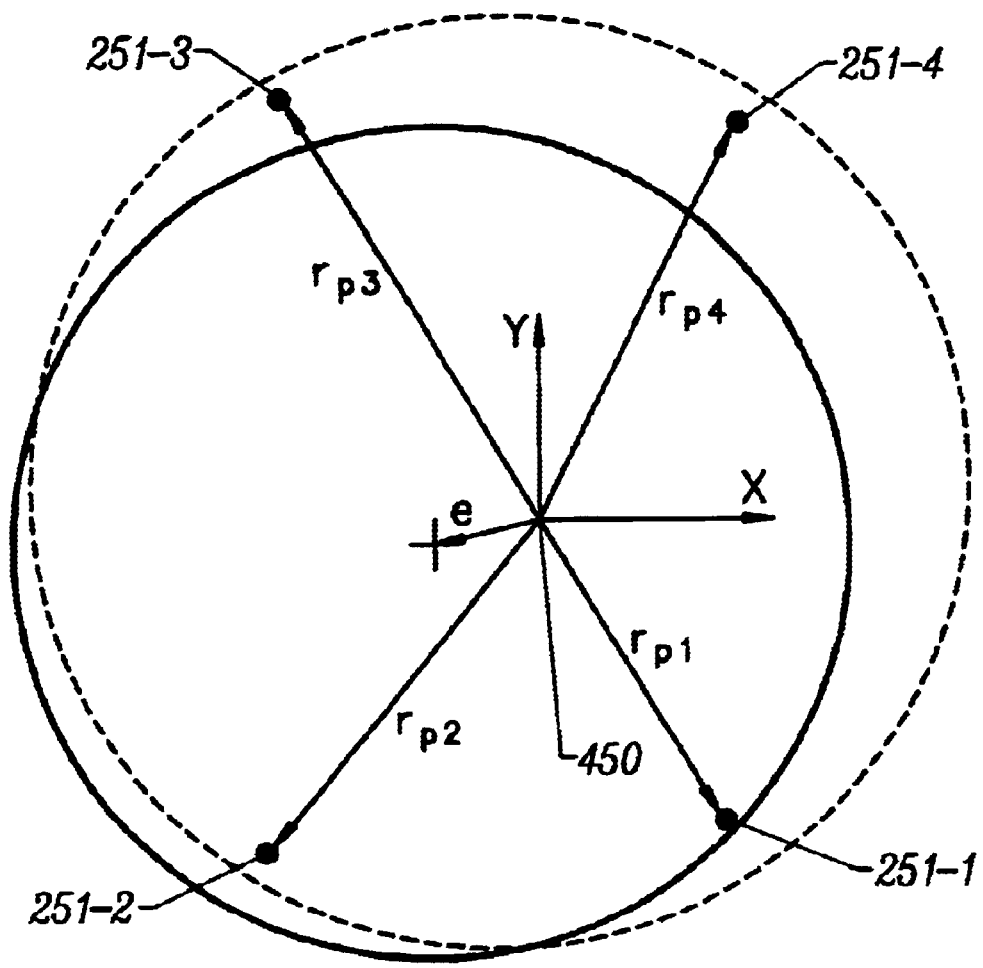
FIG. 13 is an illustration of a coordinate system having a center at the location of a wafer when placed at a desired location in a processing module, for example, showing a vector e extending from such center to the center of a wafer that is offset from the desired location.

Suboperation 448 results in the definition of the vectors $r_{pi}$ as vectors extending from the wafer center 412 to each of the four portions of the edges 254, 256, or 296 of the wafer 208 that either break or make the respective sensor 274-1 or 274-2. An exemplary one of these vectors $r_{p1}$ is shown in FIG. 11 extending to the sensor 274-2 at the time such sensor 274-2 is broken, for example. Having defined these vectors $r_{pi}$, reference is made to FIG. 13 which is an illustration of a target coordinate system having a center 450 at the location of a wafer 208 when placed at the desired location in the processing module 240, for example. FIG. 13 shows these four vectors $r_{pi}$ as vectors as vectors $r_{p1}$, $r_{p2}$, $r_{p3}$ and $r_{p4}$ extending from such center 450 to the locations of the portions of the edge 254, 256, or 296 of the wafer 208 as the wafer 208 is being moved relative to the two sensors 274-1 and 274-2. Such locations are shown by points 251-1 through 251-4 corresponding to the respective vectors $r_{p1}$, $r_{p2}$, $r_{p3}$, and $r_{p4}$.

Operation 426 then moves to suboperation 452 in which an optimization program is called. In suboperation 452 reference is made to the four points 251-1 through 251-4 defined by the four vectors $r_{pi}$, which are shown as the vectors $r_{p1}$, $r_{p2}$, $r_{p3}$, and $r_{p4}$. These four points 251-1 through 251-4 defined by the vectors $r_{p1}$, $r_{p2}$, $r_{p3}$, and $r_{p4}$ identify the actual location of the portion of the edge 254, 256, or 296 of the wafer 208 at the time the portion of the wafer edge 254, 256, or 296 causes the sensors 274-1 and 274-2 to transition. Suboperation 452 finds the wafer center position, e, which best fits the wafer to the four points 251-1 through 251-4 defined by the vectors $r_{p1}$, $r_{p2}$, $r_{p3}$, and $r_{p4}$. The edge 254, for example, of an exemplary "best fit" wafer 208 in position e is shown by dashed lines in FIG. 13. Suboperation 452 accomplishes such finding by defining the problem as a statement of an optimization problem, hence the call to the optimization program. Suboperation 452 develops the optimization problem as a two dimensional optimization problem. The statement of the best fit problem is: "find the wafer center position "e" which best fits the edge 254 of the wafer 208 to these four points $p_1$, $p_2$, $p_3$, and $p_4$ defined by the vectors $r_{p1}$, $r_{p2}$, $r_{p3}$, and $r_{p4}$." The goal is to determine the components $e_x$ and $e_y$ which will minimize the sum of the squares of the distances between each vector, $r_{pi}$, and the wafer edge (e.g., edge 254). The function to be minimized is given by the equation (1):

$$F = \sum_{i=1}^{4} \left[ R - \sqrt{(r_{pix} - e_x)^2 + (r_{piy} - e_y)^2} \right]^2$$

where R is the radius of the wafer.

Many optimization programs are suitable for executing the minimization process to solve the best fit optimization problem. For example, an optimization algorithm such as the exhaustive search is preferred. More preferred is the gradient-based algorithm such as the Newton-Raphson algorithm. Most preferred is the non-gradient-based algorithm, such as the Nelder Mead Simplex, for executing the minimization process.

Considering the execution of the minimization process using the Nelder Mead Simplex, this Simplex is applicable in multiple dimensions. The dynamic alignment situation described above is stated as a two dimensional problem in that the two X and Y coordinates are shown in FIG. 13. Therefore, the Nelder Mead Simplex is be described below in two dimensions.

Figure 14A:
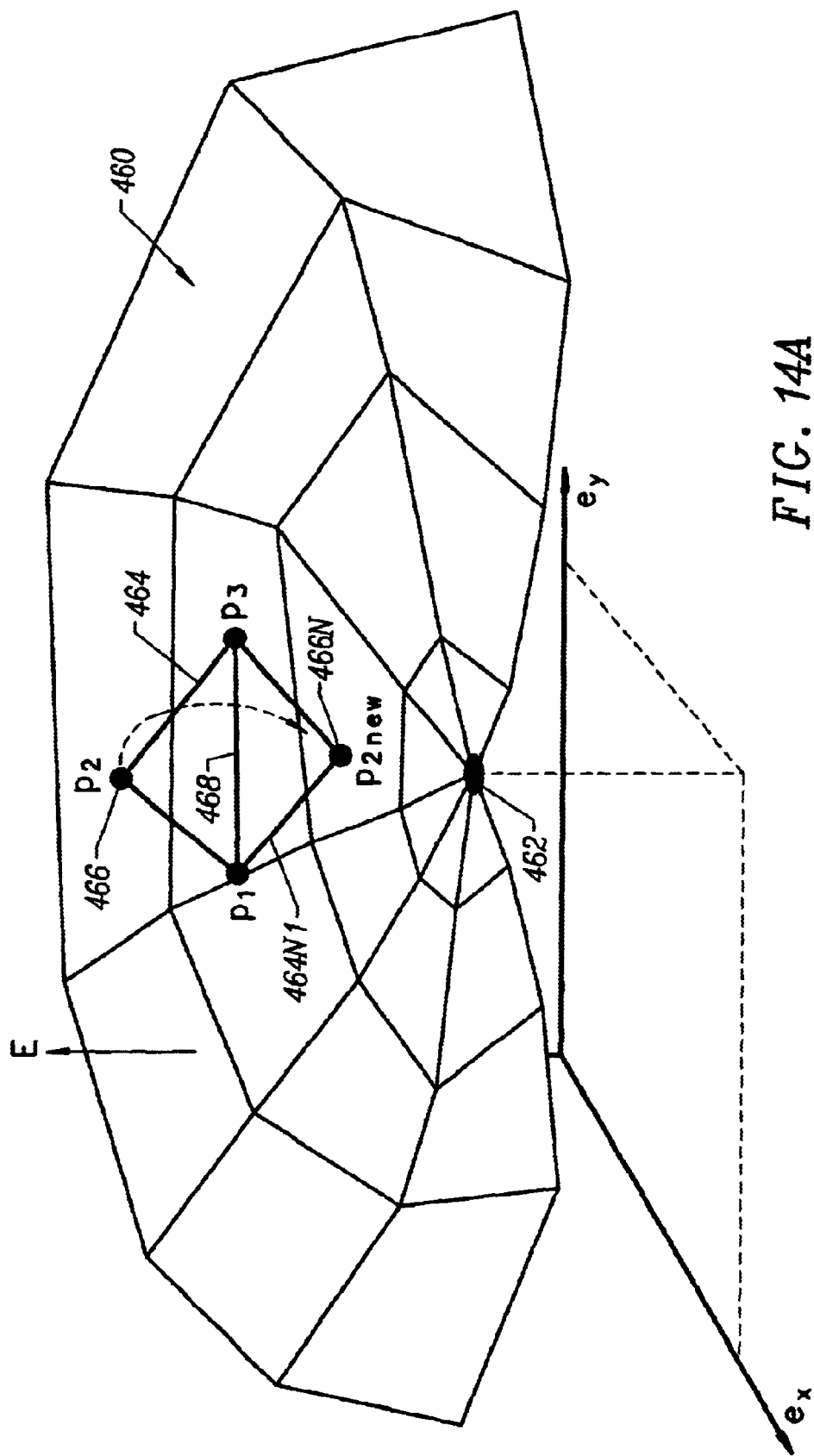
FIGS. 14A and 14B are illustrations of a three dimensional surface that is defined during processing of an equation that states the optimization problem, wherein the processing uses values for the vertices of triangles to compute values for errors.
Figure 14B:
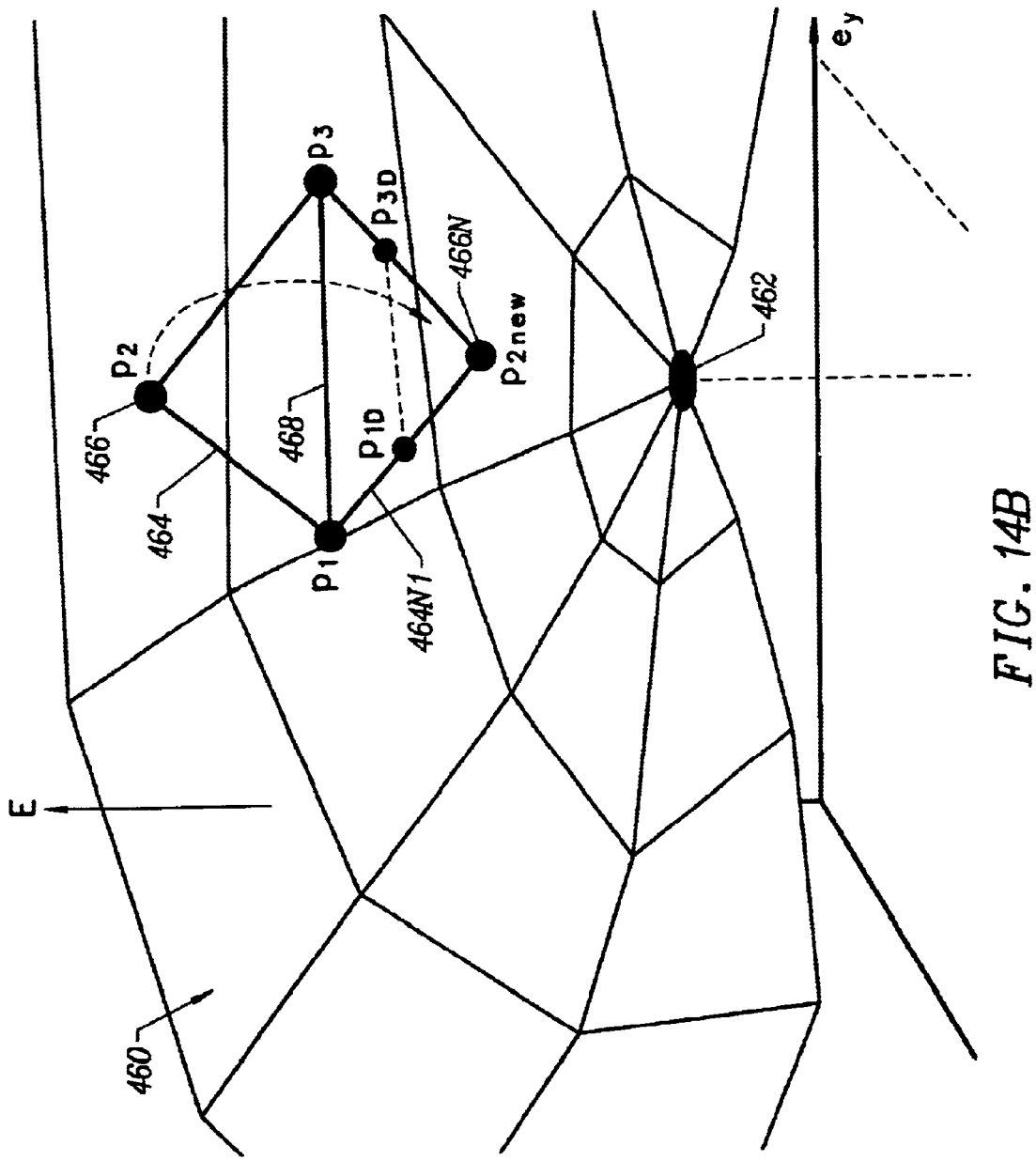

The position of the wafer 208 on the end effector 262 is described by $e_x$ and $e_y$. For any combination of $e_x$ and $e_y$ there will be some amount of error F between the location of the edge 254 of the wafer 208 and the relative locations of the sensors 274 at the time at which they transitioned (i.e., as indicated by the vectors $r_{p1}$, $r_{p2}$, $r_{p3}$, and $r_{p4}$). FIGS. 14A and 14B are illustrations of a three dimensional surface 460 formed as the error F associated with every value of $e_x$ and $e_y$ is plotted following computation of the Simplex. The goal of the best fit problem is to find the values of $e_x$ and $e_y$ that will yield the lowest error F. The lowest error F is represented by the lowest point 462 on the surface 460. The term "convergence" is used to indicate that the computation of the algorithm proceeds to a completion, and that completion finds the values of $e_x$ and $e_y$ that yield the lowest error F as represented by the lowest point 462 on the surface 460.

The processing of the Nelder Mead Simplex is as follows. The values for three sets of the coordinates $e_x$ and $e_y$ are chosen arbitrarily. As an example, an effective approach to selection of the values is to select one set where $e_x$ and $e_y$ have "0, 0" values; and a second set where $e_x$ and $e_y$ have "0, delta" values; and a third set where $e_x$ and $e_y$ have "delta, 0" values. The values of delta are very small, such as 0.010 inches This coordinate value selection approach recognizes that as the wafer 208 is moved in the path 244 the wafer 208 is generally very close to being centered, or positioned, so as to be placed in the desired position.

The chosen values of $e_x$ and $e_y$ are inserted into equation 25, the values of "i" are inserted as 1 through 4, and the three resulting errors F are obtained, one for each set. The values of F are always a positive number.

Having selected and processed three sets of coordinates, three points, or vertices, $p_1$, $p_2$, and $p_3$ are obtained, and form a geometric FIG. 464 shown in FIGS. 14A and 14B. When the Nelder Mead Simplex optimization algorithm is processed, the geometric FIG. 464 is referred to as a "simplex." In this two dimensional problem, the simplex 464 is a triangle. Each of the vertices $p_1$, $p_2$, and $p_3$ of the simplex 464 is evaluated to determine the error F. The vertex $p_2$ having the highest error F is identified as 466 and is moved by reflecting that highest error point 466 through the base 468 of the triangle 464. The moving and reflecting of the point 466 may be referred to as "flipping," and defines a new point 466N, such that a next triangle 464N1 is formed. The coordinate of the new point 466N of next triangle 464N1 is inserted into equation 25, the values of "i" are inserted as 1 through 4, and the resulting error F is obtained corresponding to the new point 466N. Again, the value of the error F corresponding to each of the three sets of coordinates of the next triangle 464N1 is evaluated to identify the highest error F.

A computational cycle including the evaluation and flipping process is repeated until none of the resulting three points 466 (derived from points $p_1$, $p_2$ and $p_3$) is significantly lower on the surface 460 than the other point, or until no reflection can be made that improves (decreases) the value of the error F. In a standard manner depicted in FIG. 14B, the triangle 464 is decreased in size by selecting vertices such as points $p_{1d}$ and $p_{3d}$ for example, for use with the vertex 466N. The insertion, calculation, evaluation, and flipping process is continued until all the errors are within a specified tolerance, such as 0.0005 inches. The tolerance corresponds, for example, to the desired accuracy of the placement of the wafer 208 at the desired location in the processing module 240. The point (e.g., possibly one of $p_1$, $p_3$ or $p_{2new}$) having the desired value represents the bottom, or lowest point, 462 of the surface 460, and has the coordinates $e_x$ and $e_y$ that define the wafer center position e which best fits the edge 254 of the wafer 208 to the four points $p_1$, $p_2$ and $p_3$ defined by the vectors $r_{p1}$, $r_{p2}$, $r_{p3}$, and $r_{p4}$. Thus, the answer to the problem posed above will have been obtained, and convergence of the processing of the optimization algorithm has been obtained.

With that answer, as described above, in terms of the target coordinates X and Y of the desired wafer location coordinate system, the placement of the wafer 208 has been determined to have the error e having the coordinates $e_x$ and $e_y$. In suboperation 470 the approximated error "e" is returned.

Having determined and returned the error "e," the program 426 continues in suboperation 472 to enable the robot 228 to be controlled so as to move the end effector 262 (and the wafer 208 thereon) so as to compensate for (i.e., substantially eliminate) the amount of the determined approximate offset e before the wafer 208 reaches the desired location in the module 240. In suboperation 472 such compensation is by modifying the original target coordinates to which the end effector 262 and the wafer 208 are nominally moved, to provide modified target coordinates. The program 426 then moves to suboperation 474 which causes the robot 228 to move the end effector 262 and the wafer 208 to the modified coordinates. As described, the modified target coordinates differ from the original target coordinates by an amount approximately equal to the error e, e.g., as defined by the coordinates $e_x$ and $e_y$. Having provided the modified target coordinates, suboperation 474 is completed when the robot 228 places the wafer 208 at the modified target coordinates, such that the wafer 208 is placed at substantially the desired location, and the operation 426 is done.

In the foregoing description, the error e is described as an "approximation" of the offset. Such term is used in view of the above reference to tolerances in the discussion of the minimization of the sum of the squares of the distances between each vector, $r_{pi}$, and the wafer edge 254. As discussed above, the geometric type of non-optimization program does not provide values of wafer offset that have a sufficient degree of accuracy. With respect to the above-described wafer offset accuracy of the present invention, e.g., within the exemplary specified tolerance of 0.0005 inches, the geometric type of non-optimization program provides substantially less accuracy (e.g., 0.020 inches when typical levels of measurement error exist).

As described above, many optimization programs are suitable for executing the minimization process to solve the best fit optimization problem. Considerations involved in selecting a suitable optimization program include the following.

Generally, each of the noted optimization programs provides wafer offset accuracy within a specified tolerance that is significantly less than that obtained with non-optimization programs. Also, as discussed below, such optimization programs will normally have an offset computation time period substantially less than the wafer transfer time period. With this in mind, selection of a suitable optimization program may take into consideration the likelihood of non-convergence, and the effect, if any, of initial non-convergence on the offset computation time period. For the above-described best fit problem, although the likelihood of non-convergence is very low using the gradient program or using the simplex program, the likelihood of non-convergence using the gradient program is greater than when using the simplex program. In other words, the simplex program has a lower likelihood of non-convergence as compared to the gradient program. As an example of non-convergence when using the gradient program, in solving the best fit problem the computation of the multi-dimensional shape may often proceed such that as the bottom is defined no minimum is found. Instead, the gradient search method computation may advance in circles around the shape and not arrive at the bottom of the shape.

Another factor to consider in selecting an optimization program relates to the above-described coordinate value selection approach in which the values of delta are very small, such as 0.010 inches. As described, initial values of coordinates are selected as including zero values. If the gradient approach has been selected and the computation does not converge using the above-described initial values of coordinates that include zero values, a second (or more) set of initial coordinates may be selected (e.g., programmed to be selected in the event of first or second non-convergence). It may be determined that, with this two (or more) step approach to the described coordinate value selection, the overall computation time period, including further recomputations using the second (or more) initial sets of coordinates, would still be less than the wafer transfer time period. In this case, the gradient algorithm would converge and provide significantly improved offset values e.g., within the exemplary specified tolerance of 0.0005 inches.

If it is determined, for example, for a particular best fit optimization problem in question, that using such two or more step coordinate value selection approach, the gradient algorithm would not have convergence within the wafer transfer time period, then the most preferred algorithm, the Nelder Mead Simplex optimization algorithm, would be used. For other reasons, one may also prefer the Nelder Mead Simplex optimization algorithm. As noted above, the likelihood of non-convergence using the gradient program is greater than when using the simplex program. Therefore, the duration of use of the Nelder Mead Simplex optimization algorithm (i.e., the offset calculation time period) is less likely to be more than the wafer transfer time period. Thus, with the Nelder Mead Simplex optimization algorithm there is much less likelihood of an inability to reach convergence within the wafer transfer time period, and much less likelihood that the offset computation would be stopped before an offset of a necessary accuracy is obtained.

Since the above minimization readily (e.g., within much less than the wafer transfer time period) reaches the minimum value of the error F having the acceptable tolerance, relatively few difficulties are faced in the present invention in keeping the offset computation time period less than the wafer transfer time period. If for example the acceptable tolerance is smaller than the exemplary 0.0005 inches, then the processing may be repeated for another computational cycle (e.g., decreasing the size of the triangle 464). Using the simplex algorithm, as compared to the exhaustive and gradient programs, the processing of such best fit problem will be most highly likely to result in determining a minimum value for the error F within the wafer transfer time period.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for determining an amount of an unknown offset of a wafer with respect to a desired wafer location, comprising the operations of:

picking up the wafer from a first location using an end effector;

moving the end effector to transport the picked up wafer from the first location past a set of sensors to produce sensor data; and processing the sensor data using an optimization program to determine an approximate value of the unknown offset.

2. A method according to claim 1, further comprising:

the moving operation including providing a robot to control the moving of the end effector; and providing the set of sensors adjacent to the first location and positioned to generate the sensor data as a series of separate signals indicating the position of the end effector each time the picked up wafer causes one of the sensors to produce an item of the sensor data.

3. A method according to claim 1, wherein if there is an unknown offset the picking up operation results in the picked up wafer being misaligned with respect to a desired position of the picked up wafer on the end effector, wherein the desired wafer location is in a wafer processing module and is identified by original target coordinates, the method further comprising:

modifying the original target coordinates according to the determined approximate value of the unknown offset; and causing the end effector to place the picked up wafer in the wafer processing module at the modified target coordinates to compensate for the unknown offset.

4. A method according to claim 1, wherein the wafer has a radius "R", further comprising:

providing a coordinate system centered at the desired wafer location, the system having an X axis and a Y axis; and the processing operation expressing the sensor data in terms of a vector extending from the center of the coordinate system to each of the effective locations of each of the sensors at the time at which the moving wafer causes a particular one of the sensors to produce the sensor data, the expressing resulting in a set of the vectors, the set being identified as "$r_{pi}$", where "i" varies from 1 to 4, each of the vectors "$r_{pi}$" having a first component "$r_{pix}$" and a second component "$r_{piy}$"; and defining the unknown offset as "e" within the coordinate system, with "e" having components identified as "$e_x$", and "$e_y$", extending from the center of the coordinate system to the center of the wafer when the wafer is located so as to have each vector approximately coincide with an adjacent wafer edge, the approximation of the coinciding being indicated by determining the value of the components "$e_x$" and "$e_y$" which will minimize the sum of the squares of the distances between each vector and the adjacent wafer edge; wherein the function to be minimized is given by:

$$F = \sum_{i=1}^{4} \left[ R - \sqrt{(r_{pix} - e_x)^2 + (r_{piy} - e_y)^2} \right]^2.$$

5. A method according to claim 4, further comprising:

the processing operation being further performed by solving the last mentioned equation using a pair of the first and second respective components "$r_{pix}$" and "$r_{piy}$" corresponding to each vector "$r_{pi}$"; and repeatedly solving for "F" by substituting a plurality of values of "$e_x$" and "$e_y$" until the lowest value of "F" is obtained.

6. A method according to claim 5, wherein the desired wafer location is in a wafer processing module and is identified by original target coordinates, further comprising:

using the values of "$e_x$" and "$e_y$" corresponding to the lowest value of "F" to identify the approximate value of the offset "e"; and modifying the original target coordinates according to the determined approximate value of the unknown offset "e".

7. A method according to claim 6, further comprising:

causing the end effector to place the picked up wafer in the wafer processing module at the modified target coordinates to compensate for the unknown offset "e".

8. A method according to claim 1, wherein the processing operation solves a problem of best fitting the wafer to the sensor data, and wherein the processing operation further comprises:

defining the problem as a statement of an optimization problem; and calling the optimization program to determine an approximate value of the unknown offset.

9. A method according to claim 8, wherein the calling operation calls an exhaustive search program.

10. A method according to claim 8, wherein the calling operation calls a Newton-Raphson program.

11. A method according to claim 8, wherein the calling operation calls a Nelder-Mead Simplex program.

12. A method for determining an amount of an unknown offset of a wafer with respect to a desired wafer location within a wafer handling system, comprising the operations of:

using a robot having an end effector to support and move the wafer past a set of sensors adjacent to a particular facet of the wafer handling system to produce sensor trigger data;

providing calibrated sensor position data indicating the effective position of each sensor with respect to the particular facet; and processing the sensor trigger data and the sensor position data using an optimization program to determine an approximate value of the unknown offset.

13. A method according to claim 12, further comprising:

the processing operation determining calibrated sensor location vectors in a first coordinate system centered on an axis of the robot, wherein each calibrated sensor location vector extends from the center of a second coordinate system centered at the desired wafer location of the wafer, in the second coordinate system one of the calibrated sensor location vectors extending to each wafer edge location corresponding to the robot location at the time an item of sensor trigger data is produced, the last-mentioned determining using the calibrated sensor position data and the sensor trigger data.

14. A method according to claim 13, wherein the wafer edge location vectors are identified by "$r_{pi}$", wherein "i" has the values 1, 2, 3, and 4 corresponding to four of the items of sensor trigger data; wherein each of the corresponding four vectors "$r_{pi}$" has an "X" axis and a "Y" axis component in the second coordinate system, further comprising:

the processing of the optimization program determining the location of the wafer that best fits the four wafer edge locations with respect to the wafer edge vectors, and wherein the best fit location is obtained by optimizing the solution to the following equation:

$$F = \sum_{i=1}^{4} \left[ R - \sqrt{(r_{pix} - e_x)^2 + (r_{piy} - e_y)^2} \right]^2$$

the processing solving the equation for values of "i" equal to each of 1, 2, 3, and 4;

wherein "R" is the radius of the wafer, "$r_{pix}$" is an "X" axis component of $r_{pi}$," "$r_{piy}$" is a "Y" axis component of "$r_{pi}$" in the second coordinate system, "$e_x$" is a selected "X" axis component of an approximation of the unknown offset, "$e_y$" is a selected "Y" component of an approximation of the unknown offset, and the optimization is performed using a two dimensional simplex algorithm.

15. A method according to claim 13, further comprising:

determining the approximate value of the unknown offset according to the sum of the squares of the distances between each vector and the corresponding wafer edge.

16. A method according to claim 12, wherein if there is an unknown offset the wafer supported on the end effector is misaligned with respect to a desired position of the picked up wafer on the end effector; and wherein the robot has a nominal target location to which the robot normally moves to place the wafer at the desired wafer location in the processing module, the nominal target location having nominal target coordinates, the method further comprising:

changing the nominal target coordinates for the robot to adjusted target coordinates according to the determined approximate value of the unknown offset; and causing the robot to place the supported wafer within the wafer handling system at a position determined by the adjusted target coordinates so that the wafer is placed substantially at the desired wafer location.

17. A computer for determining an amount of an unknown offset of a wafer with respect to a desired wafer location, the computer being programmed to perform the following operations:

first causing the wafer to be picked up from a first location by an end effector;

second causing the end effector to move and transport the picked up wafer from the first location past a set of sensors to produce sensor data; and processing the sensor data using an optimization program to determine an approximate value of the unknown offset.

18. A computer according to claim 17, wherein if there is an unknown offset the first causing operation results in the picked up wafer being misaligned with respect to a desired position of the picked up wafer on the end effector, wherein the desired wafer location is in a wafer processing module and is identified by original target coordinates, the computer being programmed to perform the following operations:

modifying the original target coordinates according to the determined approximate value of the unknown offset; and third causing the end effector to place the picked up wafer in the wafer processing module at the modified target coordinates to compensate for the unknown offset.

19. A computer according to claim 17, wherein the wafer has a radius "R," the computer being programmed to perform the following operations:

providing a coordinate system centered at the desired wafer location, the system having an X axis and a Y axis; and the processing operation expressing the sensor data in terms of a vector extending from the center of the coordinate system to each of the effective locations of each of the sensors at the time at which the moving wafer causes a particular one of the sensors to produce the sensor data, the expressing resulting in a set of the vectors, the set being identified as "$r_{pi}$," where "i" varies from 1 to 4, each of the vectors "$r_{pi}$," having a first component "$r_{pix}$," and a second component "$r_{piy}$," and defining the unknown offset as "e" within the coordinate system, with "e" having components identified as "$e_x$" and "$e_y$" extending from the center of the coordinate system to the center of the wafer when the wafer is located so as to have each vector approximately coincide with an adjacent wafer edge, the approximation of the coinciding being indicated by determining the value of the components "$e_x$" and "$e_y$" which will minimize the sum of the squares of the distances between each vector and the adjacent wafer edge; wherein the function to be minimized is given by:

$$F = \sum_{i=1}^{4} \left[ R - \sqrt{(r_{pix} - e_x)^2 + (r_{piy} - e_y)^2} \right]^2.$$

20. A computer according to claim 19, the computer being programmed to perform the following operations:

the processing operation being further performed by solving the last mentioned equation using a pair of the first and second respective components "$r_{pix}$" and "$r_{piy}$" corresponding to each vector "$r_{pi}$"; and repeatedly solving for "F" by substituting a plurality of values of "$e_x$" and "$e_y$" until the lowest value of "F" is obtained.

21. A computer according to claim 20, wherein the desired wafer location is in a wafer processing module and is identified by original target coordinates, the computer being programmed to perform the following operations:

using the values of "$e_x$" and "$e_y$" corresponding to the lowest value of "F" to identify the approximate value of the offset "e," and modifying the original target coordinates according to the determined approximate value of the unknown offset "e."

22. A computer according to claim 21, the computer being programmed to perform the following operation:

causing the end effector to place the picked up wafer in the wafer processing module at the modified target coordinates to compensate for the unknown offset "e".

23. A computer according to claim 17, wherein the programming to perform the processing operation solves a problem of best fitting the wafer to the sensor data, and wherein the programming to perform the processing operation further comprises:

calling the optimization program to solve the problem of best fitting the wafer to the sensor data.

24. A computer according to claim 23, wherein the calling operation calls an exhaustive search program.

25. A computer according to claim 23, wherein the calling operation calls a Newton-Raphson program.

26. A computer according to claim 23, wherein the calling operation calls a Nelder-Mead Simplex program.

27. A computer for determining an amount of an unknown offset of a wafer with respect to a desired wafer location within a wafer handling system, the computer being programmed to perform the following operations:

first causing a robot having an end effector to support and move the wafer past a set of sensors adjacent to a particular facet of the wafer handling system to produce sensor trigger data;

providing calibrated sensor position data indicating the effective position of each sensor with respect to the particular facet; and processing the sensor trigger data and the sensor position data using an optimization program to determine an approximate value of the unknown offset.

28. A computer according to claim 27, wherein the processing operation determines calibrated sensor location vectors in a first coordinate system centered on an axis of the robot, wherein each calibrated sensor location vector extends from the center of a second coordinate system centered at the desired wafer location of the wafer, in the second coordinate system one of the calibrated sensor location vectors extends to each wafer edge location corresponding to the robot location at the time an item of sensor trigger data is produced, wherein the last-mentioned processing operation to determine the vectors uses the calibrated sensor position data and the sensor trigger data.

29. A computer according to claim 28, wherein the calibrated sensor location vectors are identified by "$r_{pi}$," wherein "i" has the values 1, 2, 3, and 4 corresponding to four of the items of sensor trigger data; wherein each of the corresponding four vectors "$r_{pi}$" has an "X" axis and a "Y" axis component in the second coordinate system, and wherein the processing of the optimization program determining the location of the wafer that best fits the four wafer edge locations with respect to the wafer edge vectors, and wherein the best fit location is obtained by optimizing the solution to the following equation:

$$F = \sum_{i=1}^{4} \left[ R - \sqrt{(r_{pix} - e_x)^2 + (r_{piy} - e_y)^2} \right]^2$$

the processing solving the equation for values of "i" equal to each of 1, 2, 3, and 4;

wherein "R" is the radius of the wafer, "$r_{pix}$" is an "X" axis component of "$r_{pi}$" and "$r_{piy}$" is a "Y" axis component of "$r_{pi}$" in the second coordinate system, "$e_x$" is a selected "X" axis component of an approximation of the unknown offset, "$e_y$" is a selected "Y" component of an approximation of the unknown offset, and the optimization is performed using a two dimensional simplex algorithm.

30. A computer according to claim 28, wherein the processing determining the approximate value of the unknown offset according to the sum of the squares of the distances between each vector and the corresponding wafer edge.

31. A computer according to claim 27, wherein if there is an unknown offset the wafer supported on the end effector is misaligned with respect to a desired position of the picked up wafer on the end effector; and wherein the robot has a nominal target location to which the robot normally moves to place the wafer at the desired wafer location in the processing module, the nominal target location having nominal target coordinates, the computer being further programmed to perform the following operations:

changing the nominal target coordinates for the robot to adjusted target coordinates according to the determined approximate value of the unknown offset; and causing the robot to place the supported wafer within the wafer handling system at a position determined by the adjusted target coordinates so that the wafer is placed substantially at the desired wafer location.

* * * * *